(12) United States Patent
Zi et al.

(10) Patent No.: US 12,009,210 B2
(45) Date of Patent: Jun. 11, 2024

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: An-Ren Zi, Hsinchu (TW); Ching-Yu Chang, Yiang County (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/132,843

(22) Filed: Apr. 10, 2023

(65) Prior Publication Data

US 2023/0245889 A1    Aug. 3, 2023

Related U.S. Application Data

(62) Division of application No. 16/991,996, filed on Aug. 12, 2020, now Pat. No. 11,626,285.

(60) Provisional application No. 62/898,497, filed on Sep. 10, 2019.

(51) Int. Cl.
*H01L 21/027* (2006.01)
*H01L 21/67* (2006.01)

(52) U.S. Cl.
CPC .... *H01L 21/0274* (2013.01); *H01L 21/67115* (2013.01)

(58) Field of Classification Search
None
See application file for complete search history.

(56) References Cited

U.S. PATENT DOCUMENTS

| | | | |
|---|---|---|---|
| 9,711,367 B1 | 7/2017 | Chien et al. | |
| 10,073,347 B1 | 9/2018 | Zi et al. | |
| 10,955,748 B2 * | 3/2021 | Hsu | B32B 17/061 |
| 2009/0163026 A1 * | 6/2009 | Rathsack | H01L 21/02087 |
| | | | 438/748 |
| 2013/0234302 A1 * | 9/2013 | Hu | H01L 29/02 |
| | | | 430/312 |
| 2013/0273740 A1 * | 10/2013 | Chang | H01L 21/3085 |
| | | | 438/694 |

(Continued)

OTHER PUBLICATIONS

Publication KR 100357 471 B1, published Oct. 18, 2002, Bake Apparatus for Semi conductive Wafer. (Year: 2002).

(Continued)

*Primary Examiner* — Alexander G Ghyka
(74) *Attorney, Agent, or Firm* — STUDEBAKER & BRACKETT PC

(57) ABSTRACT

A method of manufacturing a semiconductor device includes forming a first protective layer over an edge portion of a first main surface of a semiconductor substrate. A metal-containing photoresist layer is formed over the first main surface of the semiconductor substrate. The first protective layer is removed, and the metal-containing photoresist layer is selectively exposed to actinic radiation. A second protective layer is formed over the edge portion of the first main surface of the semiconductor substrate. The selectively exposed photoresist layer is developed to form a patterned photoresist layer, and the second protective layer is removed.

20 Claims, 29 Drawing Sheets

(56) References Cited

U.S. PATENT DOCUMENTS

| | | |
|---|---|---|
| 2017/0117146 A1 | 4/2017 | Wong et al. |
| 2017/0365468 A1 | 12/2017 | Zheng et al. |
| 2018/0046086 A1* | 2/2018 | Waller .................... G03F 7/422 |
| 2018/0067396 A1* | 3/2018 | Shing .................... G03F 7/2028 |
| 2018/0254289 A1* | 9/2018 | Huang .............. H01L 21/32134 |
| 2021/0074538 A1* | 3/2021 | Zi .......................... G03F 7/168 |

OTHER PUBLICATIONS

Notice of Allowance issued in U.S. Appl. No. 16/991,996, dated Dec. 7, 2022.
Non-Final Office Action issued in U.S. Appl. No. 16/991,996, dated Aug. 12, 2022.

* cited by examiner

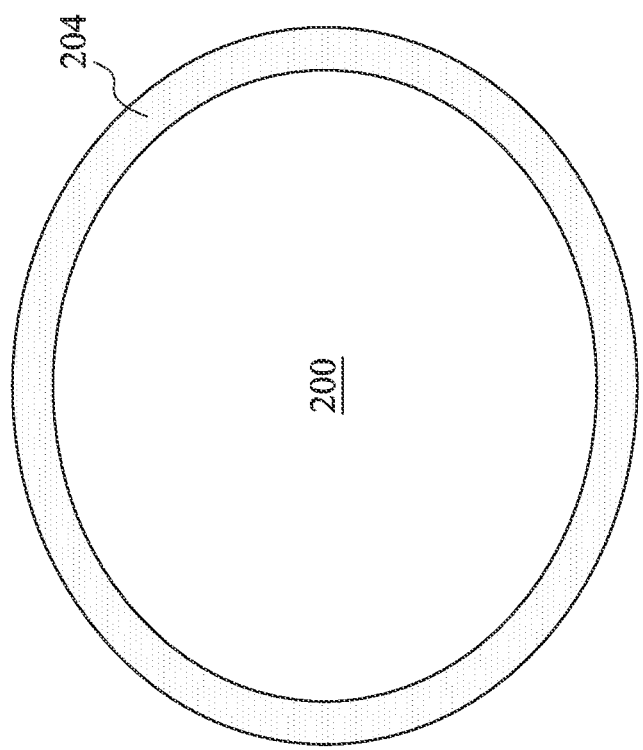
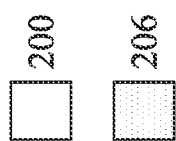
Fig. 2B

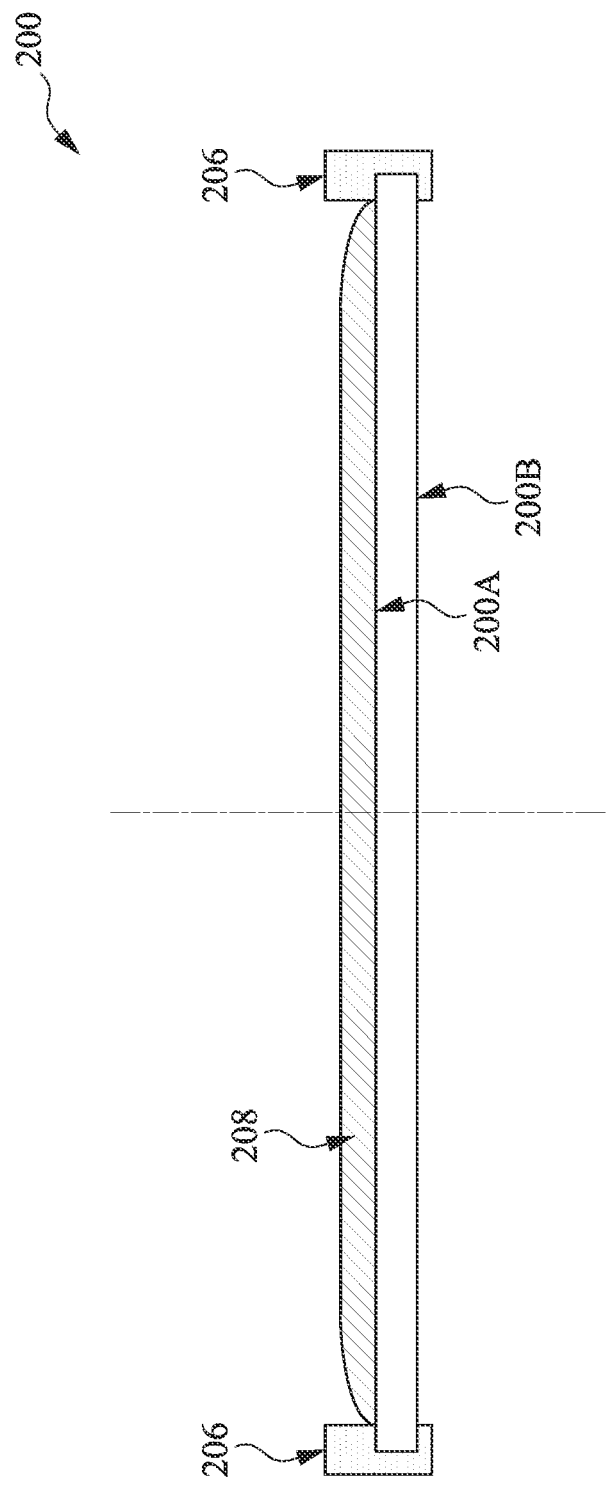

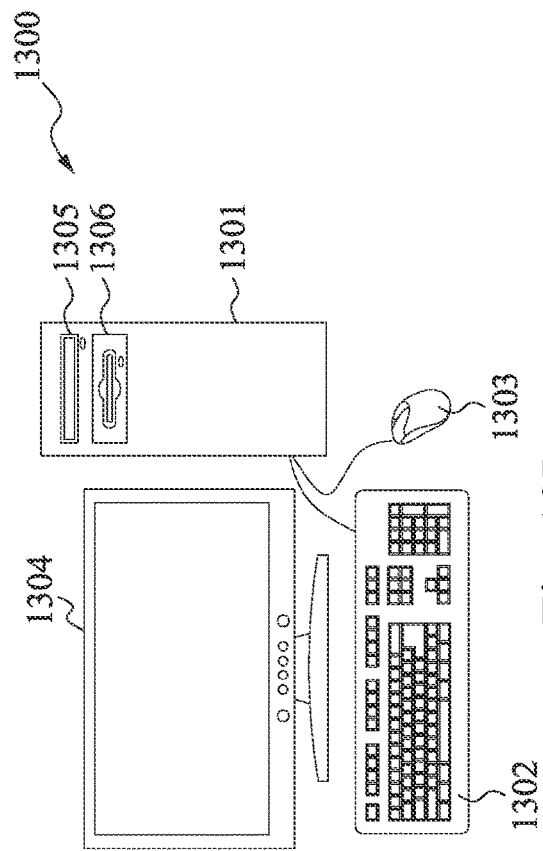

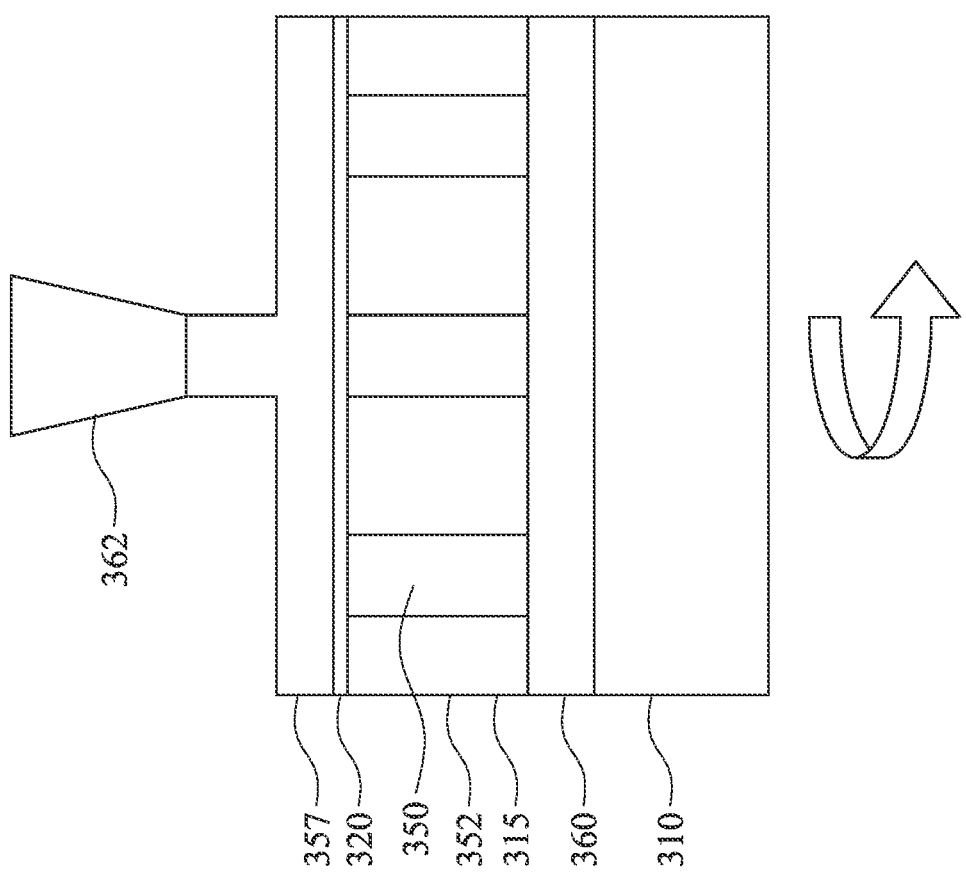

METHOD OF MANUFACTURING A SEMICONDUCTOR DEVICE

CROSS-REFERENCE TO RELATED APPLICATIONS

This application is a divisional of U.S. patent application Ser. No. 16/991,996, filed Aug. 12, 2020, now U.S. Pat. No. 11,626,285, which claims priority to U.S. Provisional Patent Application No. 62/898,497, filed Sep. 10, 2019, the entire disclosures of each of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, advanced lithography patterning technologies are implemented to form various patterns, such as gate electrodes and metal lines, on semiconductor wafers. Lithography patterning technologies include coating a resist material on the surface of a semiconductor wafer.

The existing resist coating method, such as spin coating, forms the resist material on all regions of a wafer including edges of the wafer, even to the backside surface of the wafer. The resist material on the edges and the backside surface of the wafer during the coating process and subsequent processes (such as developing) leads to various contamination-related problems and concerns, such as contaminating the coater chuck or the track. Accumulation of the resist material on the edges of the wafer will disturb patterning stability on the wafer edge and causes erroneous leveling readings during the lithography process. For example, the presence of the resist material on the bevel and backside not only increases the probability of high hotspots but also has the potential to contaminate subsequent processing tools. In other examples, existing coating processes have high resist residual at wafer edges and bevel, which may induce resist peeling and result in poor yield. Various methods are used or proposed to address the issues, such as edge bead rinse, backside rinse and additional coatings. However, undesired humps have been created by edge bead rinse and backside rinse, which is a potential defect source in the following processes. In other cases, the additional coating further introduces contaminations to wafers and the lithography system, or has additional efficiency and effectiveness concerns to manufacturing throughput. Accordingly, it is desirable to provide a system and a method of utilizing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2B is a top view of the wafer in FIG. 2A, constructed in accordance with some embodiments of the disclosure.

FIGS. 3A, 3B, and 3C are sectional views of the wafer at a fabrication stage, constructed in accordance with various embodiments of the disclosure.

FIGS. 13B and 13C show a controller according to an embodiment of the disclosure.

FIG. 18 shows a process stage of a sequential operation according to an embodiment of the disclosure.

DETAILED DESCRIPTION

Figure 1:
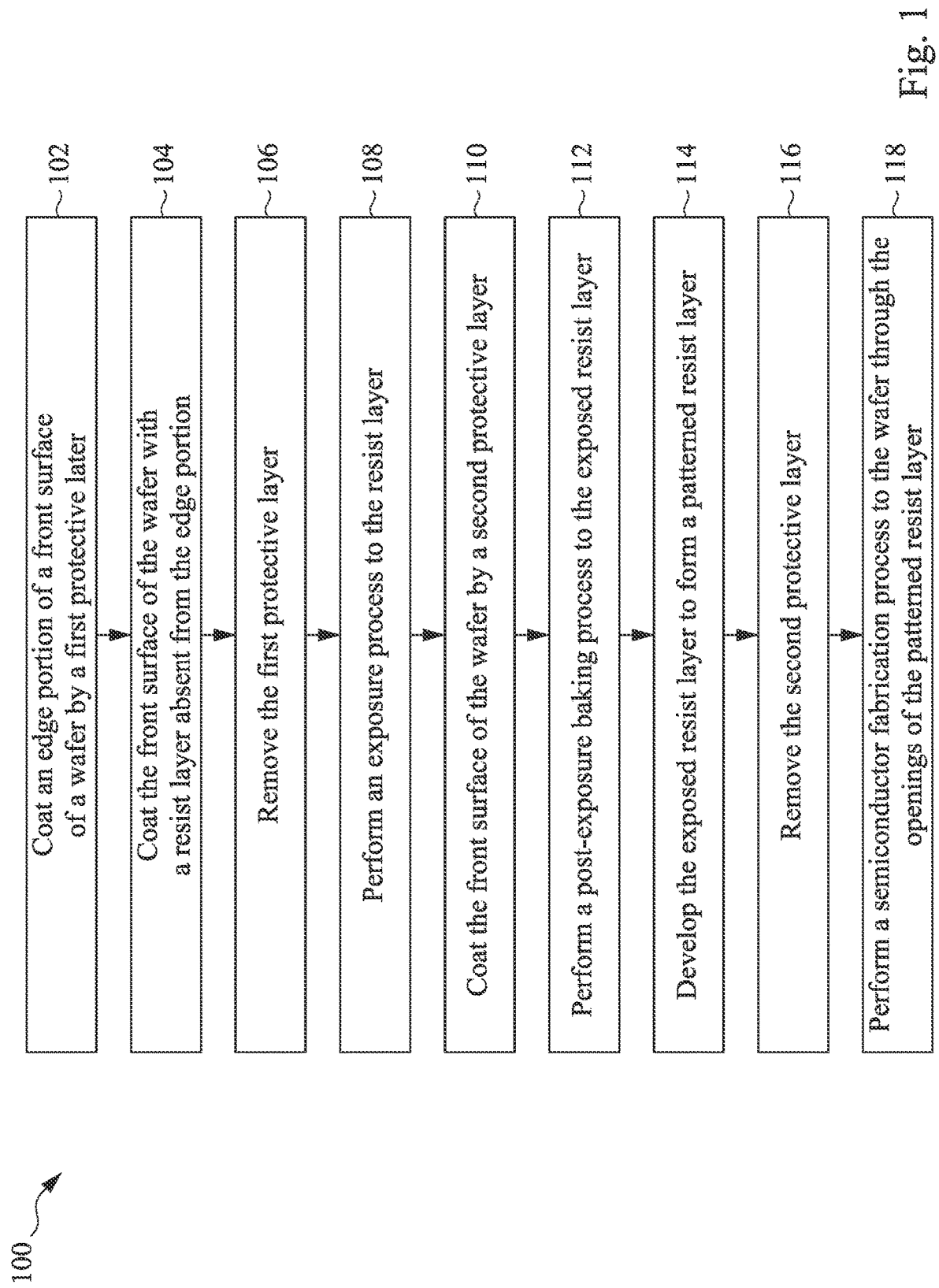
FIG. 1 is a flowchart of a method for integrated circuit fabrication in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a flowchart of a method 100 for integrated circuit fabrication in accordance with some embodiments. FIGS. 2A, 2B, 3A, 3B, 3C, 4, 7, 8, and 10-14 illustrate sectional and top views of a wafer 200 at various fabrication stages in accordance with some embodiments. The method 100, the wafer 200 and systems utilized in the method are collectively described with reference to those and other figures.

The method 100 includes an operation 102 of coating an edge portion of the wafer 200. In an embodiment, the wafer 200 is a semiconductor wafer, such as a silicon wafer. In some embodiments, the wafer 200 include other elementary semiconductors, such as germanium; compound semiconductors, such as silicon germanium, silicon carbide, gallium arsenic, gallium phosphide, indium phosphide, indium arsenide, and/or indium antimonide; or combinations thereof. In some embodiments, the semiconductor material layers are epitaxially grown on the wafer 200.

Figure 2A:
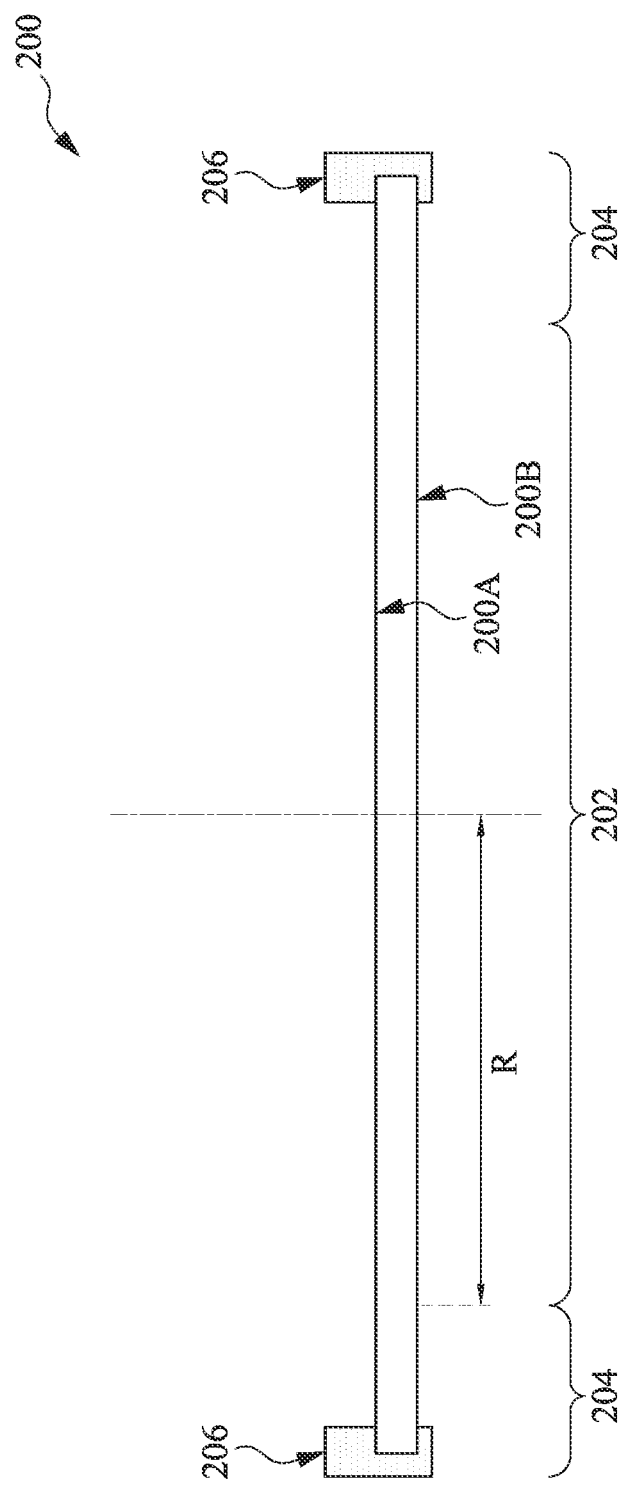
FIG. 2A is a sectional view of a wafer constructed in accordance with some embodiments of the disclosure.

As shown in FIG. 2A, the wafer 200 has a front surface 200A and an opposing backside surface 200B. In some embodiments, one or more integrated circuits are formed, partially, formed or to-be formed on the front surface 200A of the wafer 200. Therefore, the front surface 200A of the wafer 200 includes a patterned material layer or a material layer to be patterned. For example, the front surface 200A includes various isolation features (such as shallow trench isolation features), various doped features (such as doped wells, or doped source and drain features), various devices (such as transistors, diodes, imaging sensors, or resistors), various conductive features (such as contacts, metal lines and/or vias of an interconnection structure), packaging material layers (such as bonding pads and/or a passivation layer), or a combination thereof in some embodiments. On a fabricated semiconductor wafer, all above material layers and patterns may present on the front surface 200A of the semiconductor wafer 200. In some embodiments, the semiconductor wafer 200 is undergoing fabrication, and a subset of the above material layers are formed on the front surface 200A.

Figure 3A:
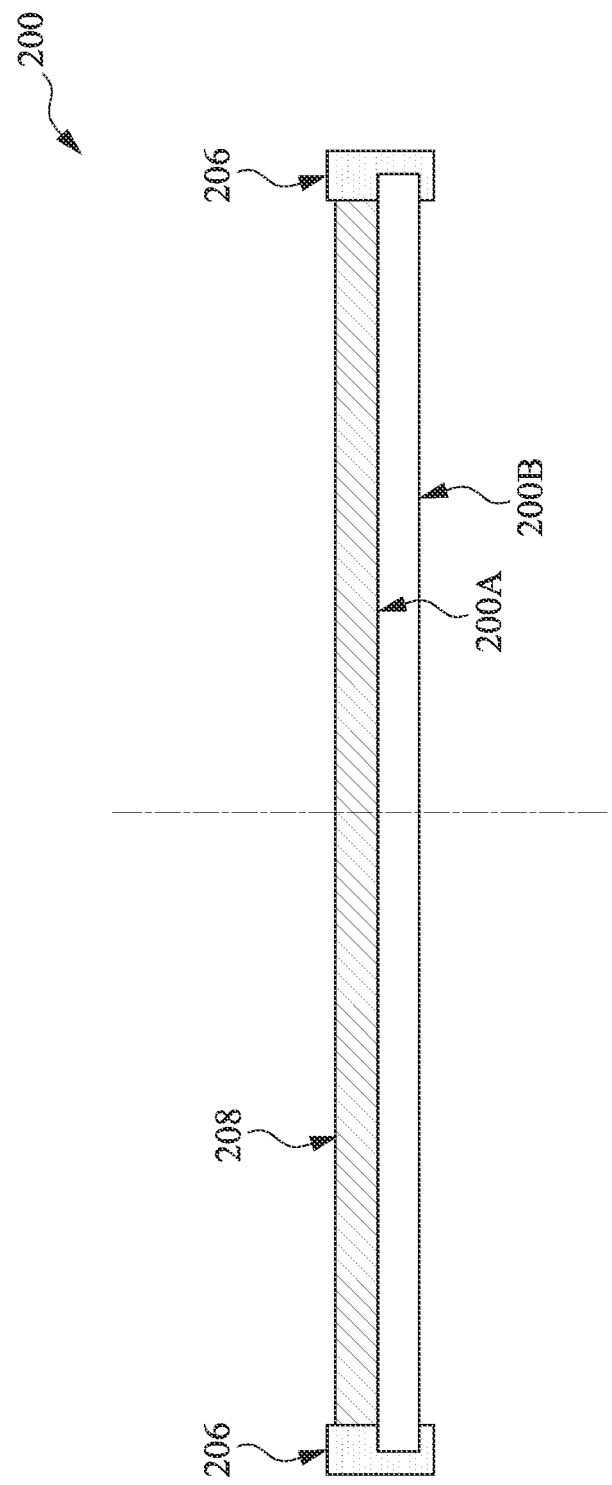

The wafer 200 includes a circuit region 202 and edge portion 204 surrounding the circuit region 202. The circuit region 202 is a region of the wafer 200 within which the integrated circuits are formed on the top surface 200A of the wafer. The circuit region 202 includes multiple integrated circuits that will be cut to form multiple integrated circuit chips at the backend of the fabrication. The circuit region 202 also includes scribing lines between the integrated circuit chips. Various test patterns may be formed in the scribing lines for various testing, monitoring and fabrication purposes. The edge portion 204 of the wafer 200 is a region without circuitry and is not patterned during the fabrication. The edge portion 204 includes a portion at the edge of the front surface 200A, and may further include a bezel surface and the edge portion of the backside surface 200B of the wafer. In operation 102, the edge portion 204 is coated with a protective layer (or first protective layer) 206, as illustrated in FIG. 3A, that constrains the edge portion 204 from direct deposition and formation of resist material thereon. The coating of the edge portion 204 of the wafer 200 is implemented through a suitable coating operation in accordance to various embodiments.

Figure 4:
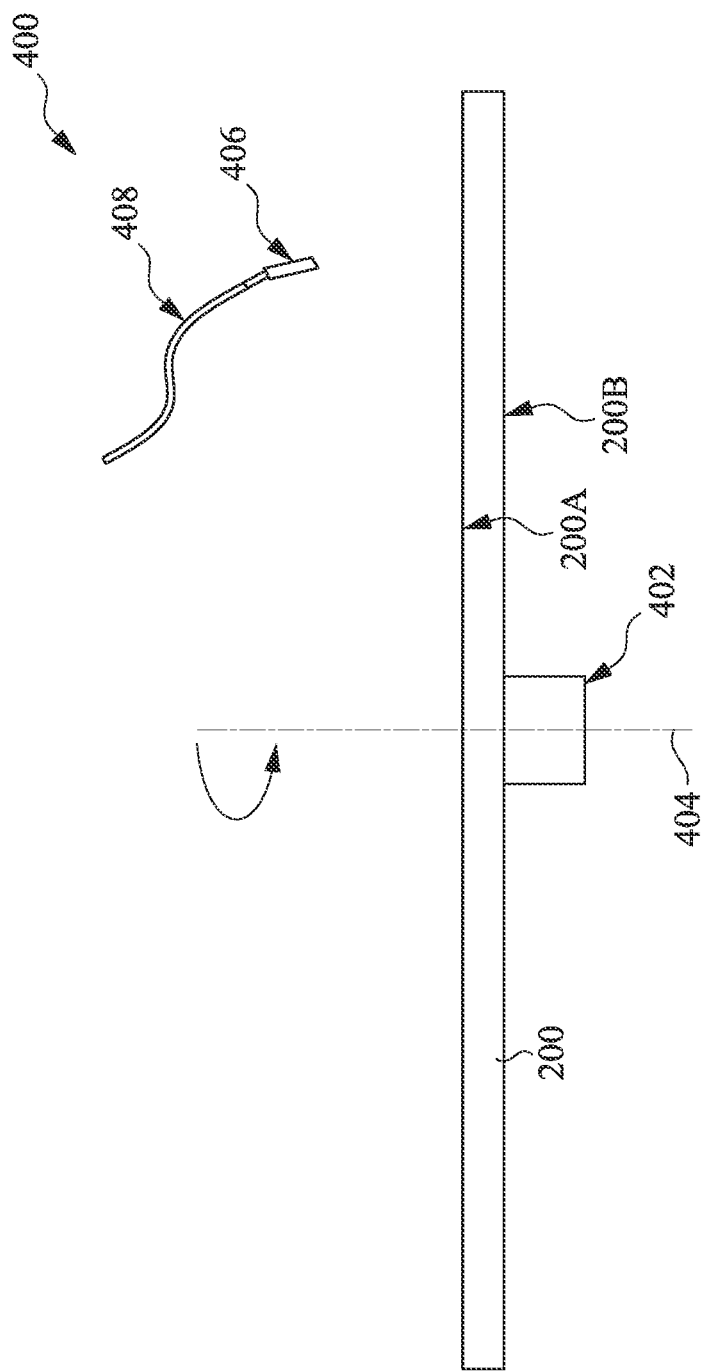
FIG. 4 is a schematic and sectional view of the wafer and a coating apparatus used by the method in FIG. 1 in accordance with some embodiments of the disclosure.

The edge portion 204 is selectively coated to form a protective layer 206 on the edge portion 204 of the wafer 200. The protective layer 206 is formed to prevent various issues caused by the resist layer coated on the edge portion of the wafer. Those issues include peeling, leveling, and contamination, especially metal contaminations from EUV resists. In some embodiments, the selective coating process includes spray coating to form the protective layer 206 on the edge portion 204 of the wafer 200. The spray coating process may use a spray coating apparatus 400, as illustrated in FIG. 4. The spray coating apparatus 400 includes a wafer stage 402 designed to secure the wafer 200 for spray coating. The wafer stage 402 is operable to rotate around the axis 404 such that the wafer 200 secured thereon spins as well. The spray coating apparatus 400 also includes a spray tip 406 to spray a protective layer chemical solution, such as a polymer-containing solution from a chemical supply 408 connected to the spray tip. The spray tip 406 is configured to aim at the edge portion 206 of the wafer 200 and is able to spray the chemical solution thereto. The operation 102 includes spraying the chemical solution on the edge portion 204 of the wafer 200 and simultaneously spinning the wafer 200, such that the chemical solution is spin coated on the edge portion 204. In some embodiments, the protective layer 206 has a thickness ranging between about 50 nm and about 100 nm.

In some embodiments, the chemical solution to be coated on the edge portion 204 of the wafer 200 includes a chemical mixture of an acid-labile group (ALG), a solubility control unit and a thermal acid generator (TAG). The chemical solution further includes a suitable solvent, such as an organic solvent or aqueous solvent. A thermal process with a suitable baking temperature will trigger the TAG to release acid; the generated acid further reacts with the ALG; which leads to the formation of a polymer material layer as the protective layer. In the present example, the solubility control unit chemically binds with the ALG, triggered by the generated acid, to form the cross-linked polymer material layer. In other examples, the chemical solution includes other monomers. In some embodiments, the ALG is initially chemically bonded to the monomer. The generated acid reacts with the ALG, causing the ALG cleaved from the monomer and the monomer to bind with the solubility control unit to form polymer. The chemical solution is sensitive to the thermal process but is free of photosensitive composition and is different from the photoresist.

Figure 5:
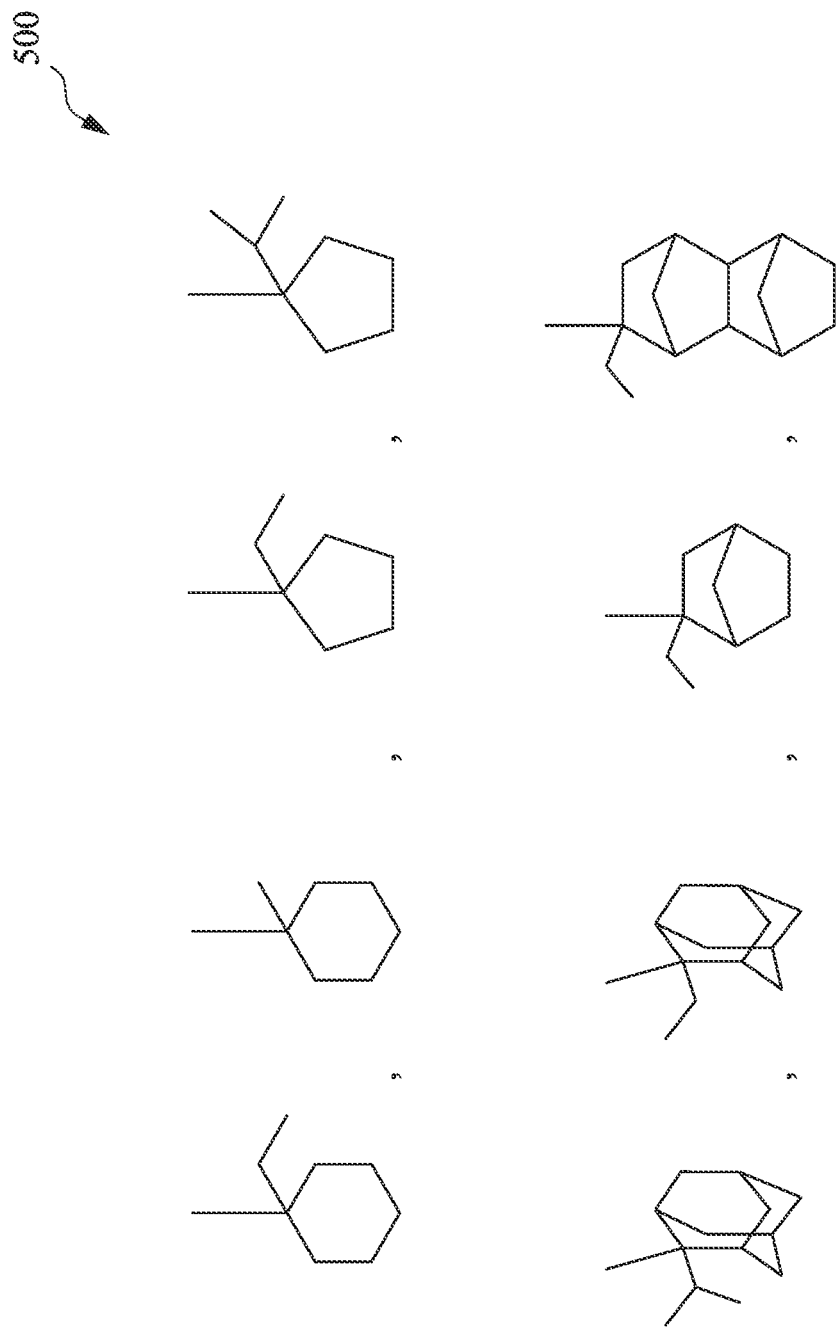
FIG. 5 illustrates a chemical structure of the acid labile groups (ALG) in the protective layer of FIGS. 3A, 3B, and 3C in accordance with various embodiments of the disclosure.
Figure 6:
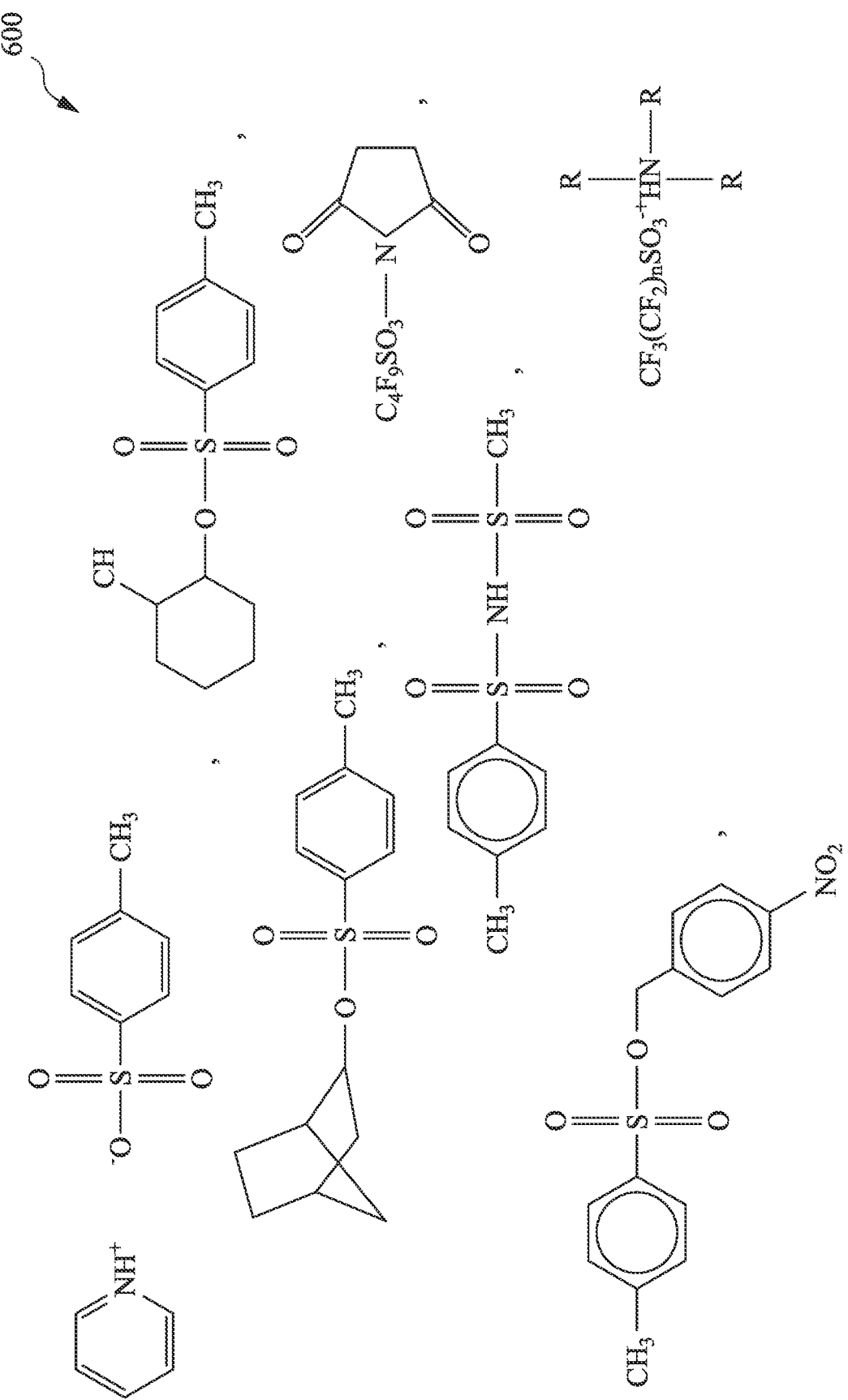
FIG. 6 illustrates chemical structure of thermal acid generators (TAGs) in the protective layer of FIGS. 3A, 3B, and 3C in accordance with various embodiments of the disclosure.

In some embodiments, the ALG includes a t-butoxycarbonyl (tBOC). FIG. 5 provides other examples of the ALG 500 in accordance with other embodiments. Carbon and hydrogen are not labeled in the above formulas according to convention. In some embodiments, the TAG is chosen from $NH_4^+C_4F_9SO_3^-$ and $N_4^+CF_3SO_3^-$. FIG. 6 provides other examples of the TAG 600 in accordance with other embodiments. Carbon and hydrogen are not labeled in the above formulas according to convention. In some embodiments, the solubility control unit is chosen from a lactone, ester, ether, ketone, and combinations thereof.

The ALG, solubility control unit, and TAG in the chemical solution are mixed in a certain ratio. The total weight $W_0$ of the ALG and the solubility control unit in the chemical solution is used as reference. The weight of the ALG over the total weight $W_0$ ranges between about 30% and about 70%. The weight of the solubility control unit over the total weight $W_0$ ranges between about 70% and about 30%. The weight of the TAG over the total weight $W_0$ ranges between 3% and 20%.

The solubility control unit controls the solubility of the protective layer in a particular removal chemical. Thus, the protective layer is able to be selectively removed by the particular removal chemical while the resist layer is able to remain. In other words, the particular removal chemical is able to dissolve the chemical groups of the protective layer 206 corresponding to the solubility control units, and therefore is able to dissolve the protective layer. Since the resist layer is free of the solubility control unit, the resist layer remains in the removal chemical. In some embodiments, this particular removal chemical is a chemical solution (or removing solution) having a mixture of propylene glycol methyl ether (PGME) and propylene glycol methyl ether acetate (PGMEA). In some embodiments, the removing solution includes 70% PGME and 30% PGMEA, also referred to OK73.

The operation 102 further includes a curing operation to cure the protective chemical solution to form the protective layer 206 in some embodiments, such as curing at elevated temperature or by ultraviolet irradiation, causing the coated chemical solution to cross-link to form a polymer material as the protective layer 206 at the edge portion 204 as described earlier. In some embodiments, the curing process is a thermal baking process with a baking temperature high enough to trigger the TAG to release acid. In this consideration, the TAG is chosen such that the baking temperature in the thermal curing process is close to the temperature $T_{PEB}$ of the post-exposure baking, such as $T_{PEB}+/-20°$ C., such as in a range between about 130° C. and about 170° C. The thermal curing process may have duration of about 60 seconds. In some embodiments, the thermal curing process is carried out at a temperature of about 40° C. and about 120° C. for about 10 seconds to about 10 minutes.

Figure 7:
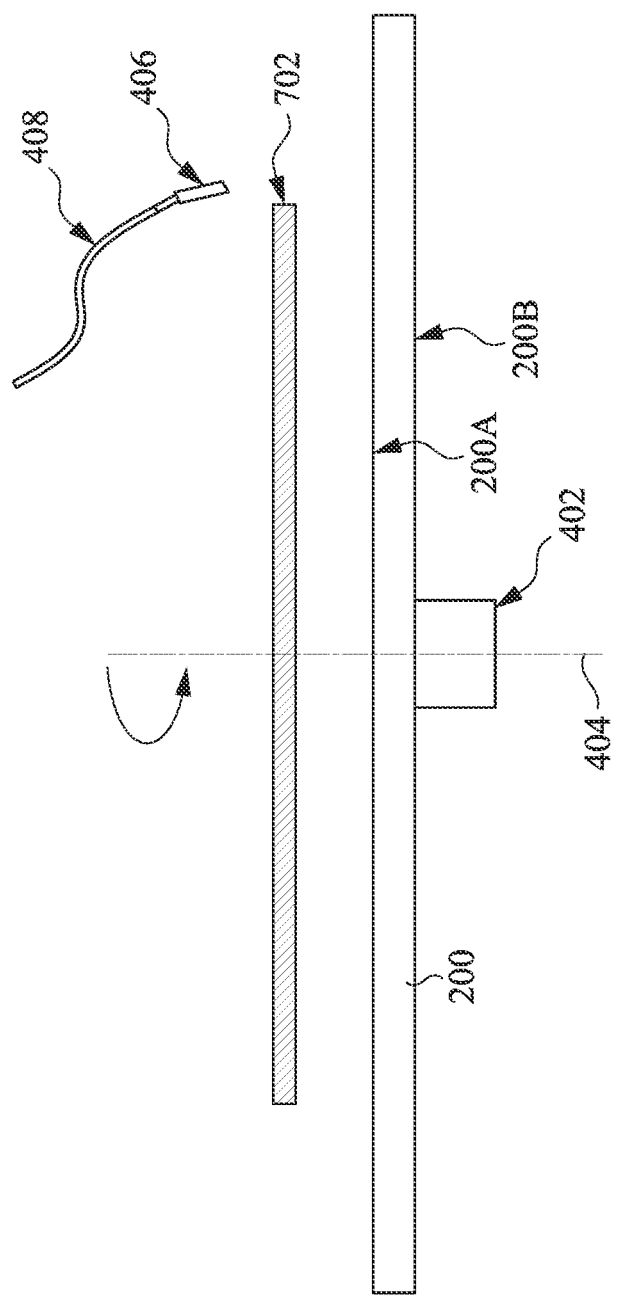
FIG. 7 is a schematic and sectional view of the wafer and a coating apparatus used by the method in FIG. 1 in accordance with some embodiments of the disclosure.
Figure 8:
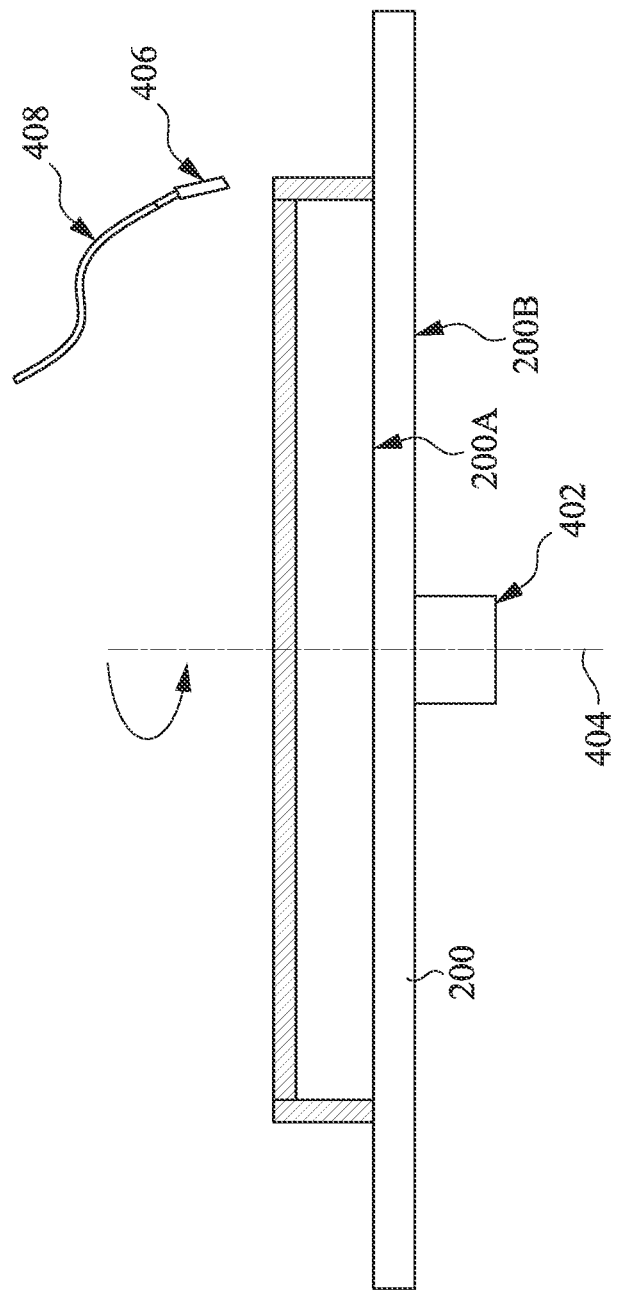
FIG. 8 is a schematic and sectional view of the wafer and a coating apparatus used by the method in FIG. 1 in accordance with some embodiments of the disclosure.
Figure 9:
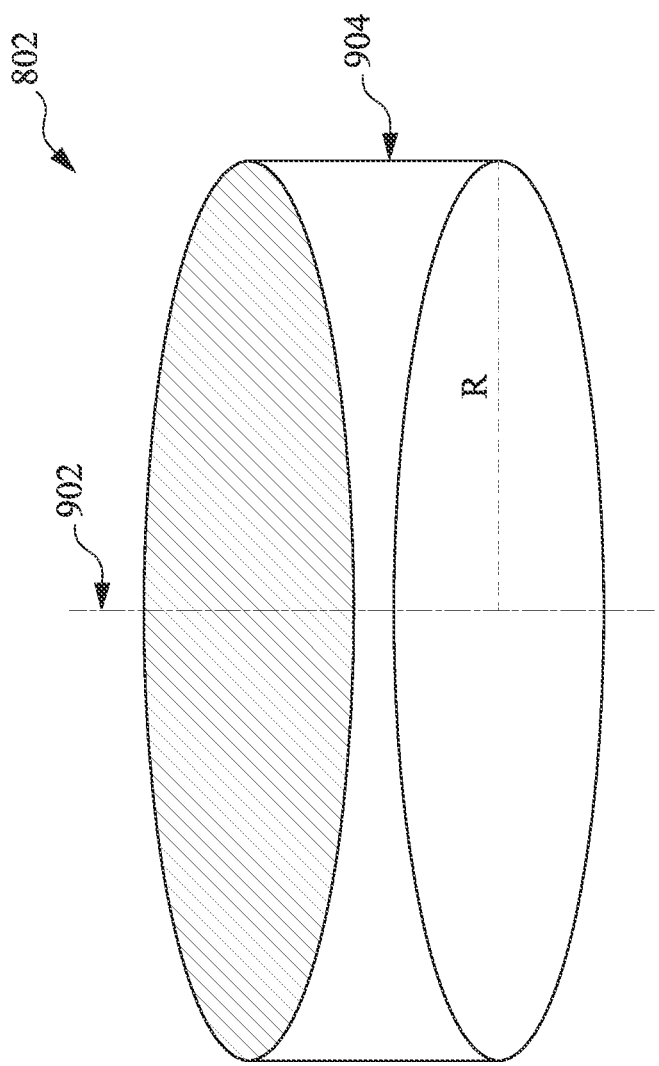
FIG. 9 is a schematic view of a blocker used in the coating apparatus of FIG. 8 in accordance with some embodiments of the disclosure.

In some embodiments, a selective coating mechanism includes a blocker 702 having a special design, as illustrated in FIG. 7. The blocker 702 is designed with a shape, a size, and a configuration to prevent the circuit region 202 of the wafer 200 from being coated by the protective chemical solution. In some embodiments, the blocker 702 has a round shape having a size matching to and covering the circuit region 202 of the wafer 200. In some embodiments, a blocker 802 for this purpose has a different shape, including a sidewall, to effectively prevent the circuit region 202 of the wafer 200 from being coated by the protecting chemical solution, as illustrated in FIG. 8. FIG. 9 is a schematic view of the blocker 802. The blocker 802 includes a round plate 902 and a sidewall 904 connected together. During the selective coating process, the blocker 802 is positioned such that the circuit region 202 of the wafer is substantially covered from top and side so that the protecting chemical solution cannot be dispensed to the circuit region 202. Specifically, the round plate 902 has a radius equal to or close to the radius R of the circuit region 202 of the wafer 200.

In some embodiments, the protective layer 206 has a width of about 1 mm to about 5 mm along the edge of the wafer 200.

Figure 3C:
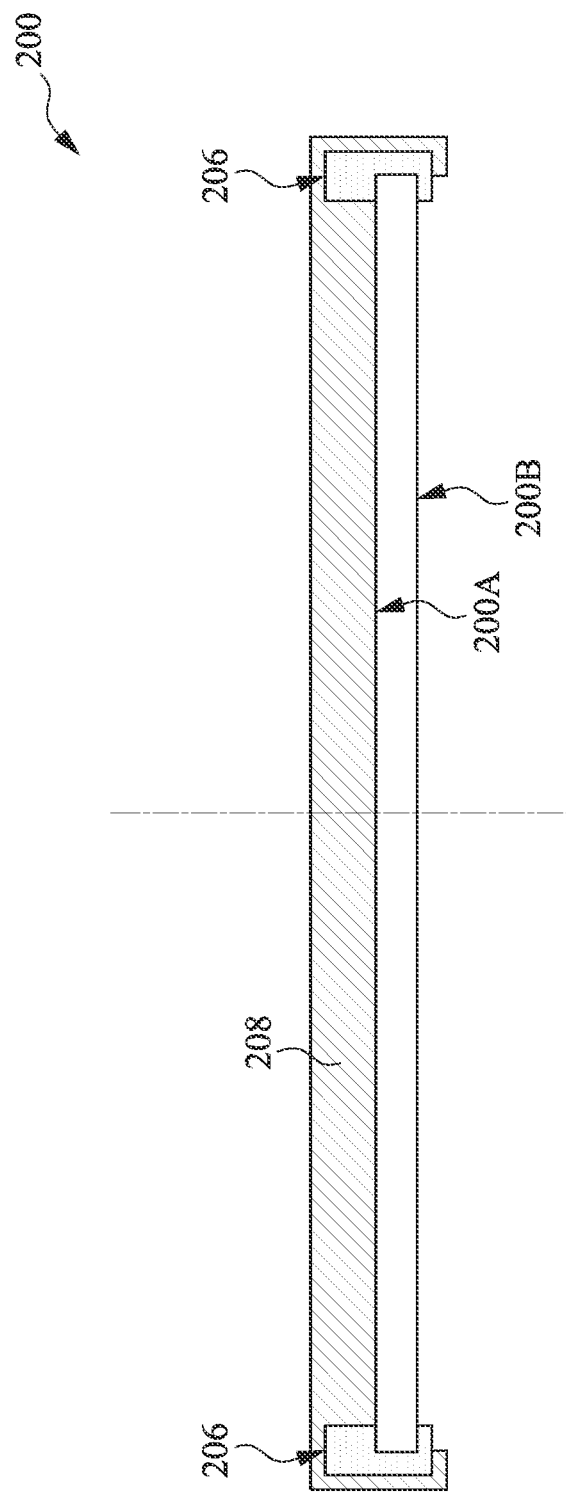

Referring back to FIG. 1, after the formation of the protective layer 206 on the edge portion 204 of the wafer 200 by the operation 102, the method 100 proceeds to an operation 104 of coating a photoresist layer 208 on the wafer 200, as illustrated in FIG. 3A. Specifically, the resist layer 208 is coated on the front surface 200A of the wafer 200 in the circuit region 202 while the resist layer 208 is constrained from the edge portion 204. Alternatively, due to the surface tension, composition differences among the wafer, the protective layer, and the photoresist material, the edge of the photoresist layer 208 may have a different geometry, such as rounded edge, as illustrated in FIG. 3B. In other embodiments, the photoresist layer 208 may spread to the edge portion 204 and is disposed on the protective layer 206, as illustrated in FIG. 3C.

In some embodiments, the protective layer 206 has a thickness of 0.5 times to 3 times the thickness of the photoresist layer 208.

The photoresist layer 208 is sensitive to radiation used in a lithography exposure operation and has resistance to etching or implantation in some embodiments. In some embodiments, the photoresist layer 208 is formed by spin-on coating process. In some embodiments, the photoresist layer 208 is further subjected to a pre-exposure baking process at a temperature ranging from about 40° C. to about 120° C. In some embodiments, the photoresist layer 208 is sensitive to actinic radiation, such as I-line light, a deep ultraviolet (DUV) light (e.g., 248 nm radiation by krypton fluoride (KrF) excimer laser or 193 nm radiation by argon fluoride (ArF) excimer laser), extreme ultraviolet (EUV) light (e.g., 13.5 nm light), an electron beam (e-beam), and an ion beam.

The photoresist layer 208 may include a photosensitive chemical, a polymeric material, and a solvent. In some embodiments, the resist layer 208 uses a chemical amplification (CA) photoresist material. In some embodiments, the CA photoresist material is a positive tone photoresist and includes a polymer material that becomes soluble to a developer after the polymeric material is reacted with an acid. In another embodiment, the CA photoresist material is negative tone photoresist and includes a polymer material that becomes insoluble to a developer, such as a base solution, after the polymer is reacted with acid. In yet another embodiment, the CA photoresist material includes a polymer material that changes its polarity after the polymer is reacted with acid so that either exposed portions or unexposed portions will be removed during a developing operation, depending on the type of developer (organic solvent or aqueous solvent). In some embodiments, the CA photoresist includes a photoacid generator (PAG) as the photosensitive chemical. In some embodiments, the photoresist includes other additives, such as sensitizers. The polymer material in a CA resist material may further include an acid-labile group. As noted above, the protective layer 206 is a cross-linked polymer in some embodiments so that it will not be dissolved during the resist coating.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose, otherwise known as a leaving group or, in some embodiments in which the PAC is a photoacid generator, an acid labile group, is attached to the hydrocarbon structure so that, it will react with the acids/bases/free radicals generated by the PACs during exposure. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer to underlying structures (e.g., substrate). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group, which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

Additionally, some embodiments of the photoresist include one or more photoactive compounds (PACs). The PACs are photoactive components, such as photoacid generators, photobase generators, free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzophenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl) phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments. In some embodiments, the photoresist composition includes about 1 wt. % to about 10 wt. % of a photoactive compound (PAC) based on the total weight of the PAC and the polymer.

In some embodiments, a cross-linking agent is added to the photoresist. The cross-linking agent reacts with one group from one of the hydrocarbon structures in the polymer and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

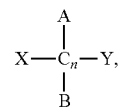

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

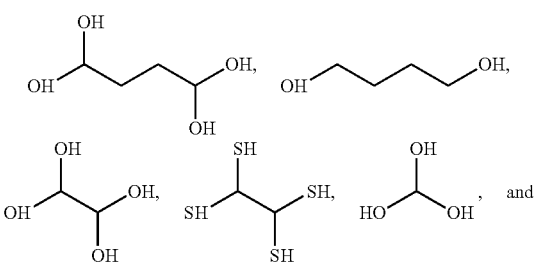

-continued

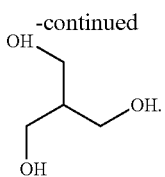

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

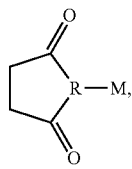

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR, —SO2N(R*)$_2$; —SO$_2$R*; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

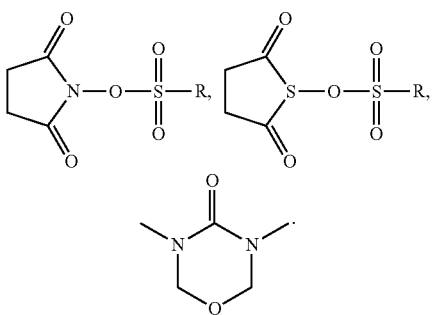

Some embodiments of the photoresist are metal-containing photoresists. In some embodiments, the metal-containing photoresist forms a metal-containing photoresist layer. The metals in the metal-containing photoresist includes one or more of Cs, Ba, La, Ce, In, Sn, or Ag in some embodiments.

In some embodiments, the metal-containing photoresist includes metal oxide nanoparticles. The metal oxide nanoparticles are selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof in some embodiments. As used herein, nanoparticles are particles having an average particle size between about 1 and about 10 nm. In some embodiments, the metal oxide nanoparticles have an average particle size between about 2 and about 5 nm. In some embodiments, the amount of metal oxide nanoparticles in the photoresist composition ranges from about 1 wt. % to about 10 wt. % based on the total weight of the photoresist composition. In some embodiments, metal oxide nanoparticle concentrations below about 1 wt. % provide photoresist layers that are too thin, and metal oxide nanoparticle concentrations greater than about 10 wt. % provide a photoresist composition that is too viscous and that will be difficult to provide a photoresist coating of uniform thickness on the substrate.

In some embodiments, the metal oxide nanoparticles are complexed with carboxylic acid or sulfonic acid ligands. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the HfMAA or ZrMAA are dissolved at about a 5 wt. % to about 10 wt. % weight range in a coating solvent, such as propylene glycol methyl ether acetate (PGMEA). In some embodiments, a concentration of metal in the metal-containing photoresist layer ranges from 10 wt. % to 80 wt. % based on the total weight of the metal-containing photoresist layer after drying off the solvent. In some embodiments, a concentration of metal in the metal-containing photoresist layer ranges from 20 wt. % to 50 wt. % based on the total weight of the metal-containing photoresist layer after drying off the solvent.

In some embodiments, the photoresist layer is a tri-layer photoresist. A tri-layer photoresist includes a bottom layer (also referred to as an under layer), a middle layer, and a top layer (the top layer may also be referred to as a photosensitive layer). In some embodiments, the bottom layer includes a $C_xH_yO_z$ material, the middle layer includes a $SiC_xH_yO_z$ material, and the top layer includes a $C_xH_yO_z$ material. The $C_xH_yO_z$ material of the bottom layer is the same material as the $C_xH_yO_z$ material of the top layer in some embodiments, and are different materials in other embodiments. The top layer also includes a photoactive compound, such as a photoacid generator (PAG). This allows a photolithography process to be performed to pattern the top layer. In some embodiments, the top layer is patterned by a photolithography process, which may include one or more exposure, baking, developing, and rinsing processes (not necessarily performed in this order). The photolithography process patterns the top layer into a photoresist mask, which may have one or more trenches or openings that expose the middle layer therebelow. The middle layer is then etched using the photoresist mask to form a patterned middle layer, and the bottom layer is then etched using the patterned middle layer to form a patterned bottom layer in some embodiments. The patterned bottom layer is then used to pattern the various layers below. In embodiments where the photoresist layer is a tri-layer photoresist, the metal-containing material is located in any one of the bottom layer, the middle layer, the top layer, or in all of these layers.

Figure 10:
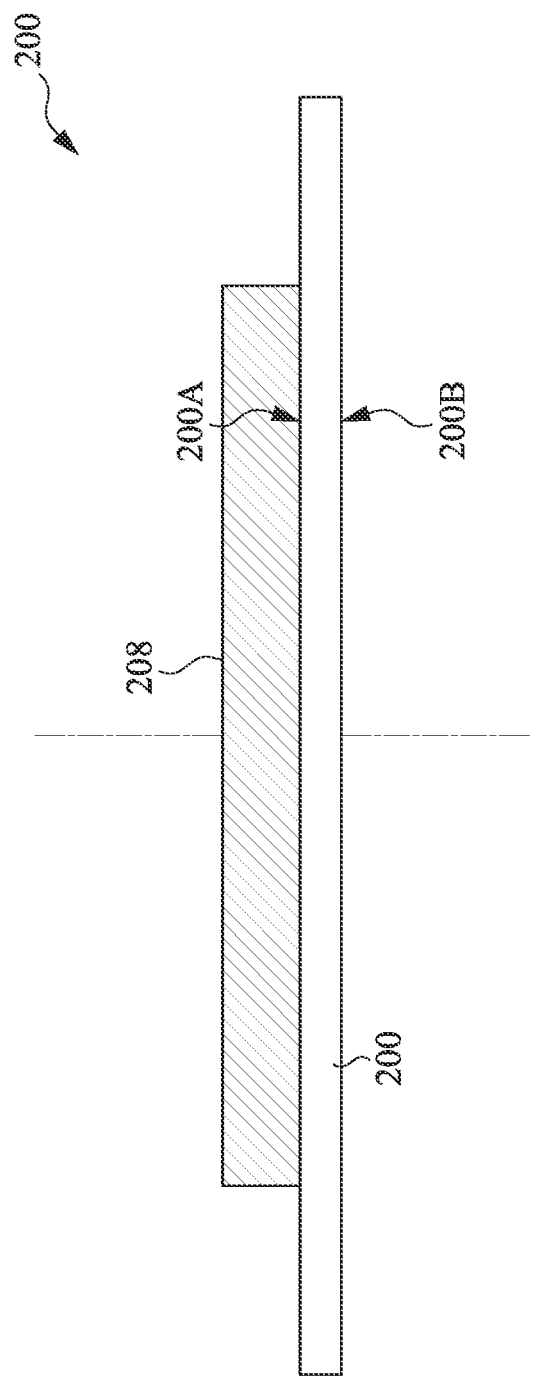
FIG. 10 shows a process stage of a sequential operation according to an embodiment of the disclosure.

Referring to FIGS. 1 and 10, the method 100 proceeds to operation 106 by removing the protective layer 206 from the wafer by the particular removing solution that selectively removes the protective layer 206, such as 70% propylene glycol monomethyl ether+30% propylene glycol monomethylether acetate (OK73) in some embodiments. Thus, the edge portion 204 of the wafer 200 is free of the resist layer 208. Furthermore, since the removing solution is designed to selectively remove the protective layer 206, the resist layer 208 remains after the removal of the protective layer 206. The protective layer 206 is removed prior to applying an exposure process to the resist layer since the protective layer 206 may introduce contaminants to the lithography system and to the following wafers to be exposed in the lithography system.

In some embodiments, a cleaning solution is applied to the wafer 200 to remove contaminants, such as metals from the metal-containing photoresist. The cleaning solution is applied to a back side of the wafer and/or the side edges of the wafer. The wafer is cleaned because the wafer transferring process (e.g., as the wafer 200 is transferred from one semiconductor fabrication tool to another semiconductor fabrication tool) may involve physical contact with the back side or the side edges of the wafer 200. For example, as the wafer 200 is transferred out of a semiconductor fabrication tool, such as an EUV lithography apparatus in an embodiment, various components of the semiconductor fabrication tool may come into contact with the bottom (e.g., back side) or side portions of the wafer 200. Through such contact, the metals may be left on the semiconductor fabrication tool. If a subsequent process performed by that semiconductor fabrication tool is supposed to be metal-free, then the metals on left on the semiconductor fabrication tool may be a contaminant.

Further, if the metals are not thoroughly cleaned off of the wafer 200, the metals may contaminate a new semiconductor fabrication tool as the wafer is loaded into the new semiconductor fabrication tool. This may be exacerbated by various heating processes, which facilitate the escape of metal-containing material from the wafer 200 or photoresist layer 208. The new (and now contaminated) semiconductor fabrication tool may subsequently be required to perform a semiconductor fabrication process in a metal-free environment, in which case the presence of the metals is undesirable. For these reasons, the metals are cleaned off using the cleaning solution. To enhance the effectiveness of the cleaning, the cleaning solution is configured to mostly target the back side and the side edges of the wafer 200, although the front side of the wafer 200 may be optionally cleaned as well.

The material compositions of the cleaning solution are configured to enhance the removal of the metals from the wafer 200. In some embodiments, the cleaning solution includes two cleaning solutions having different compositions, a first cleaning solution and a second cleaning solution. The first cleaning solution is an aqueous or organic solution including a first solvent. In some embodiments, the cleaning solution includes a first solvent having Hansen solubility parameters of $25>\delta_d>13$, $25>\delta_p>3$, and $30>\delta_4>4$.

The units of the Hansen solubility parameters are (Joules/cm$^3$)$^{1/2}$ or, equivalently, MPa$^{1/2}$ and are based on the idea that one molecule is defined as being like another if it bonds to itself in a similar way. $\delta_d$ is the energy from dispersion forces between molecules. $\delta_p$ is the energy from dipolar intermolecular force between the molecules. $\delta_h$ is the energy from hydrogen bonds between molecules. The three parameters, $\delta_d$, $\delta_p$, and $\delta_h$, can be considered as coordinates for a point in three dimensions, known as the Hansen space. The nearer two molecules are in Hansen space, the more likely they are to dissolve into each other.

Solvents having the desired Hansen solubility parameters include propylene glycol methyl ether, propylene glycol ethyl ether, γ-butyrolactone, cyclohexanone, ethyl lactate, dimethyl sulfoxide, acetone, ethylene glycol, methanol, ethanol, propanol, propanediol, n-butanol, water, 4-methyl-2-pentanone, hydrogen peroxide, isopropanol, dimethyl formamide, acetonitrile, acetic acid, toluene, tetrahydrofuran, and butyldiglycol.

In some embodiments, the first cleaning solution includes from 0.1 wt. % to 5 wt. % of one or more surfactants based on the total weight of the first cleaning solution. In some embodiments, the surfactant is selected from the group consisting of alkylbenzenesulfonates, lignin sulfonates, fatty alcohol ethoxylates, and alkylphenol ethoxylates. In some embodiments, the surfactant is selected from the group consisting of sodium stearate, 4-(5-dodecyl) benzenesulfonate, ammonium lauryl sulfate, sodium lauryl sulfate, sodium laureth sulfate, sodium myreth sulfate, dioctyl sodium sulfosuccinate, perfluorooctanesulfonate, perfluorobutanesulfonate, alkyl-aryl ether phosphate, alkyl ether phosphates, sodium lauroyl sarcosinate, perfluorononanoate, perfluorooctanoate, octenidine dihydrochloride, cetrimonium bromide, cetylpyridinium chloride, benzalkonium chloride, benzethonium chloride, dimethyldioctadecylammonium chloride, dioctadecyldimethylammonium bromide, 3-[(3-cholamidopropyl)dimethylammonio]-1-propanesulfonate, cocamidopropyl hydroxysultaine, cocamidopropyl betaine, phospholipidsphosphatidylserine, phosphatidylethanolamine, phosphatidylcholine, sphingomyelins, octaethylene glycol monodecyl ether, pentaethylene glycol monodecyl ether, polyethoxylated tallow amine, cocamide monoethanolamine, cocamide diethanolamine, glycerol monostearate, glycerol monolaurate, sorbitan monolaurate, sorbitan monostearate, sorbitan tristearate, and combinations thereof.

In some embodiments, the surfactant is one or more ionic surfactants, polyethylene oxide and polypropylene oxide, non-ionic surfactants, and combinations thereof.

In the method 100, various operations, such as spin-coating, baking, removing of the protective layer and developing are implemented in a cluster tool referred to as a track (or clean track). The track includes multiple stages designed to secure a wafer for chemical processing or thermal processing, referred to as chemical stages and thermal stages, respectively. Each chemical stage is operable to spin the secured wafer and to dispense a chemical to the wafer by a spray tip while the wafer is spinning. Chemical stages can be used for spin-coating, developing, cleaning, and removing (such as resist stripping). A thermal stage is designed to secure a wafer and to heat the secured wafer, such as a hot plate. Thermal stages can be used for various baking, such as post-exposure baking. A wafer may be transferred to different stages in the track for various chemical and thermal processing. In some embodiments of the method 100, the operations 104 and 106 are implemented on a same chemical stage (referred to as a first chemical stage in the following description) of the track to increase the efficiency. Particularly, when the wafer is transferred to the first chemical stage, a first spray tip (or nozzle or spray head) is positioned to dispense a first chemical (that is the solution of resist material) to the wafer 200 secured on the first chemical stage for resist coating, and thereafter a second spray tip is positioned to dispense a second chemical (that is the removing solution, i.e.—OK73 in some embodiments) to the wafer 200 remaining on the first chemical stage for removing the first protective layer 206.

Figure 11:
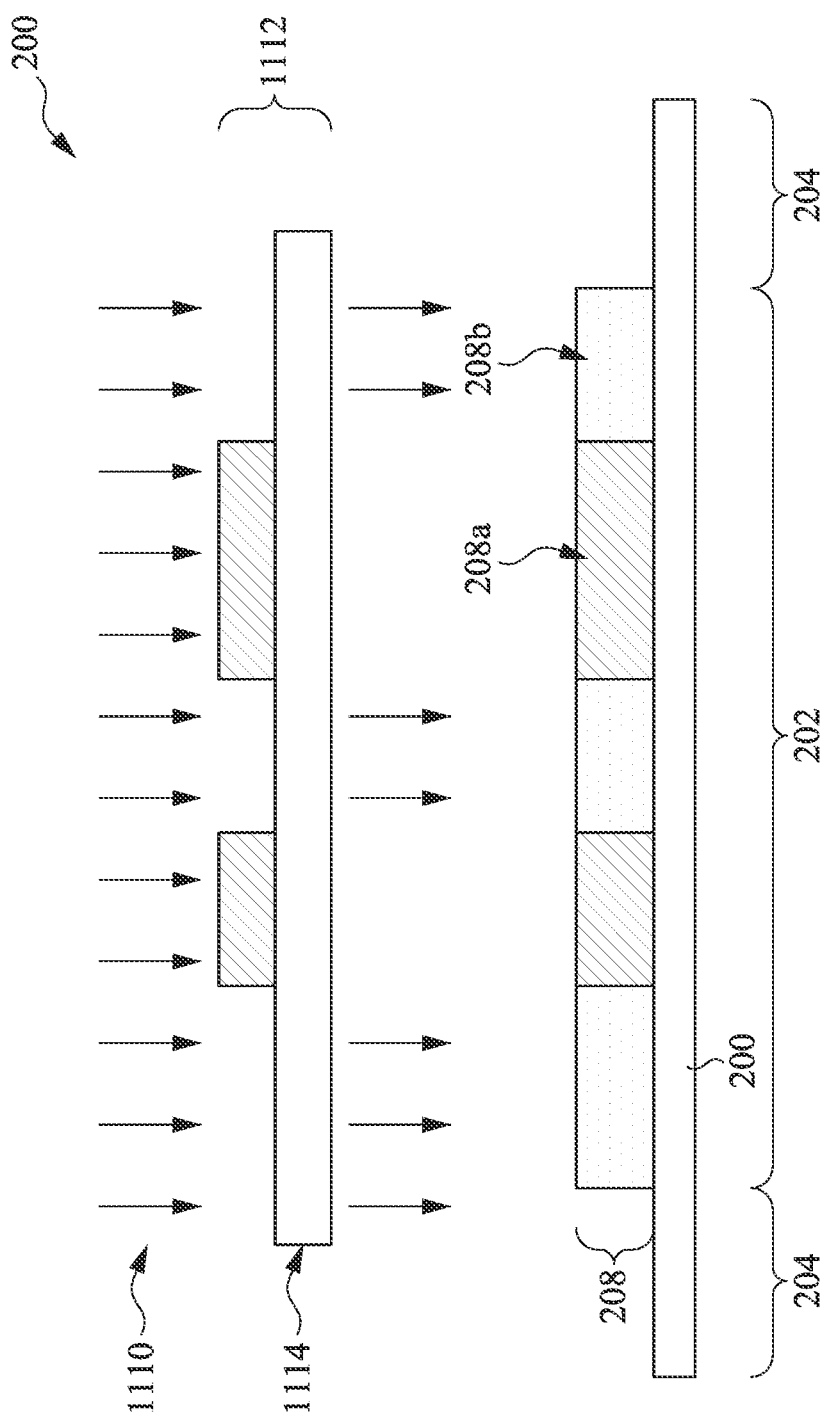
FIG. 11 shows a process stage of a sequential operation according to an embodiment of the disclosure.

Referring to FIGS. 1 and 11 the method 100 proceeds to operation 108 by selectively exposing the resist layer 208 to actinic radiation 1110 in a lithography system. The radiation 1110 may be an I-line, a DUV radiation, an EUV radiation, e-beam, or other suitable radiation. The operation 108 may be performed in air, in a liquid (immersion lithography), or in a vacuum (e.g., for EUV lithography and e-beam lithography). In some embodiments, the radiation beam 1110 is patterned with a mask 1112, such as a transmissive mask or a reflective mask, which may include resolution enhancement techniques such as phase-shifting, off-axis illumination (OAI) and/or optical proximity correction (OPC). In some other embodiments, the radiation beam is directly modulated with a predefined pattern, such as an IC layout, without using a mask (such as using a digital pattern generator or direct-write mode). In the illustrative embodiment, the radiation beam is directed to a transmissive mask 1112 that includes a transparent substrate (such as fused quartz) 1114, a patterned opaque layer (such as chromium) 1116.

After the operation 108, a latent pattern is formed on the photoresist layer 208. The latent pattern of a resist layer refers to the exposed pattern on the resist layer, which eventually becomes a physical resist pattern, such as by a developing process. The latent pattern of the resist layer 208 includes unexposed portions 208a and exposed portions 208b. In an embodiment using a CA photoresist material with PAG, acids are generated in the exposed portions 208b during the exposure process. In the latent pattern, the exposed portions 208b of the resist layer 208 are physically or chemically changed. In some examples, the exposed portions 208b are de-protected, inducing polarity change for dual-tone imaging (developing). In other examples, the exposed portions 208b are changed in polymerization, such as depolymerized as in positive resist or cross-linked as in negative resist.

Figure 12:
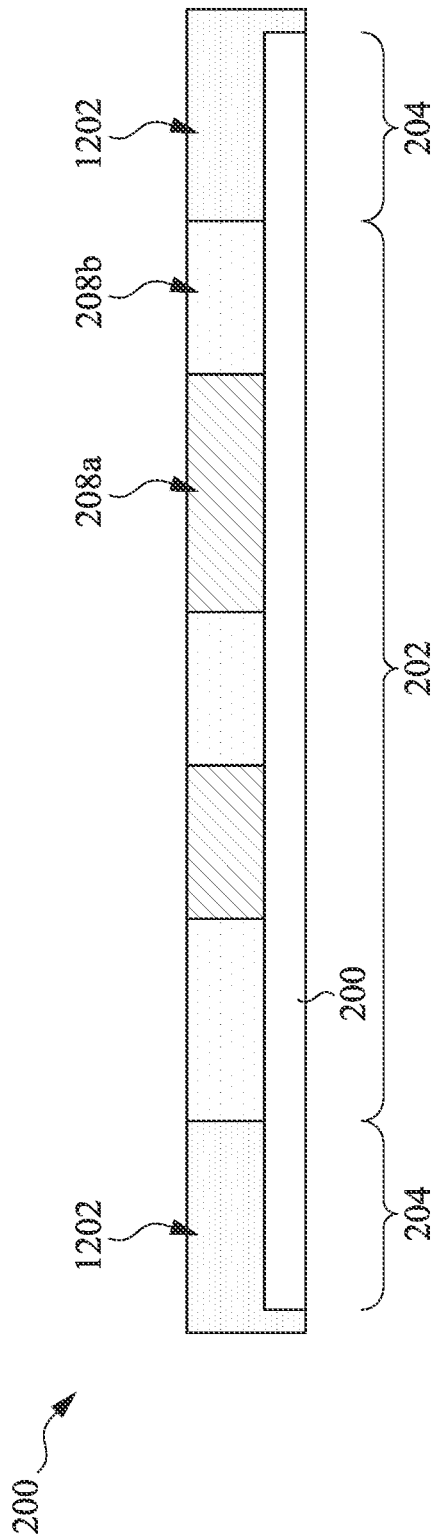
FIG. 12 shows a process stage of a sequential operation according to an embodiment of the disclosure.

Referring to FIGS. 1 and 12, the method 100 then proceeds to operation 110 by coating a second protective layer 1202 on the edge portion 204 of the wafer 200 after the exposure process at the operation 108 and before the following operations, such as post-exposure baking and developing. Thus, the edge portion 204 of the wafer 200 is protected from any contamination during subsequent operations. The second protective layer 1202 is substantially similar to the first protective layer 206 in terms of composition and formation. For example, the chemical solution is first coated on the edge portion 204 of the wafer 200 by spin-coating and is then cured to form a polymer material as the second protective layer 1202. The chemical solution includes a chemical mixture of an ALG, a solubility control unit and a TAG. The chemical solution further includes a suitable solvent, such as organic solvent or aqueous solvent. A thermal process with a proper baking temperature will trigger the TAG to release acid; the generated acid further react with the ALG; which leads to the formation of the polymer material.

Referring to FIGS. 1, 13A, 13B, and 13C, the method 100 then proceeds to operation 112 by performing a post-exposure baking (PEB) process on the photoresist-coated wafer 200. During the PEB process, more acids are generated and the exposed portions of the resist material 208 are changed chemically (such as more hydrophilic or more hydrophobic). In a specific embodiment, the PEB process may be performed in a heating chamber at temperature ranging between about 90° C. and about 130° C. for about 60 seconds to about 120 seconds.

Figure 13A:
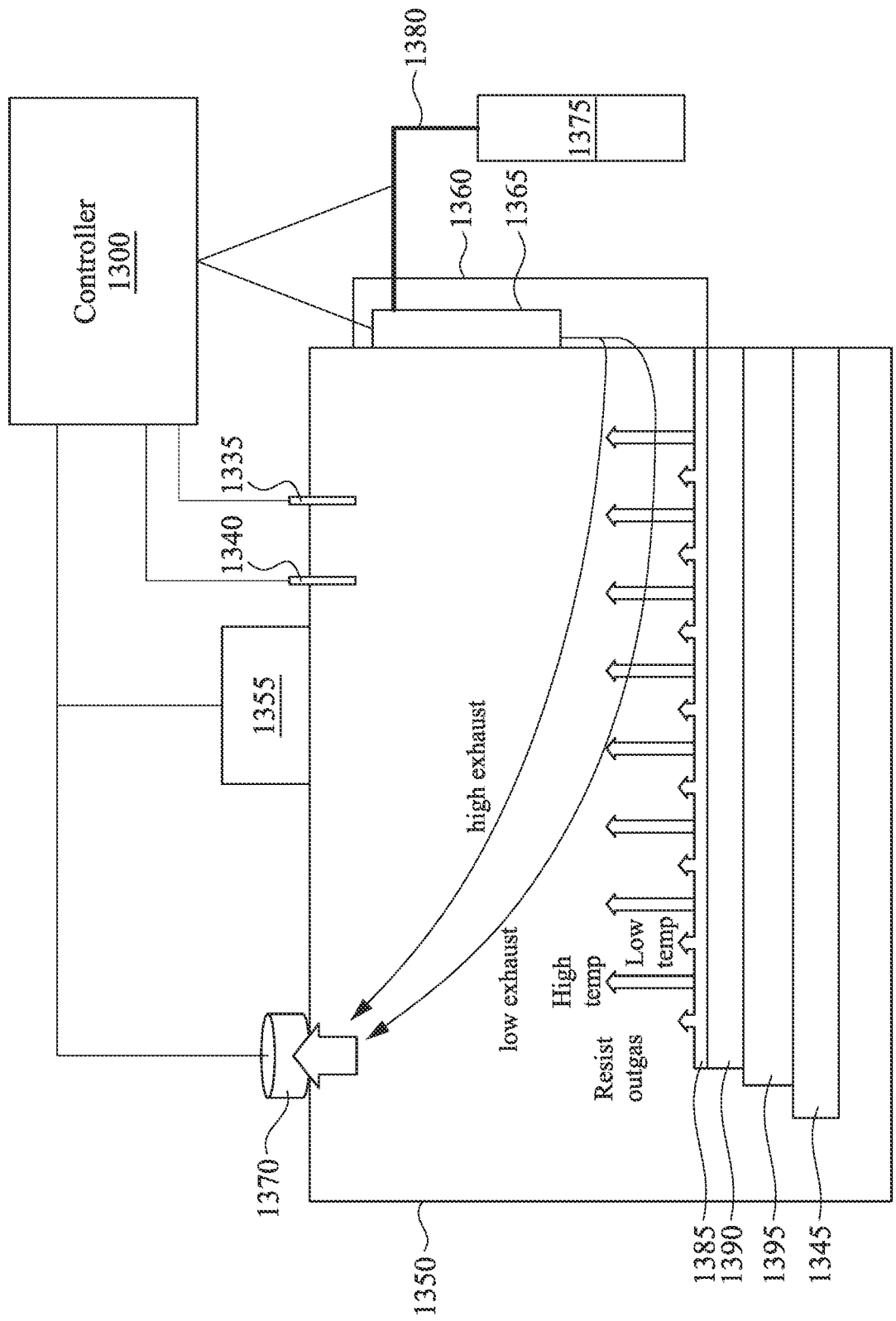
FIG. 13A shows an apparatus including a heating chamber according to an embodiment of the disclosure.

In some embodiments, a semiconductor manufacturing apparatus includes a heating chamber 1350, and a semiconductor substrate support 1345 in the heating chamber. A schematic illustration of the heating chamber 1350 is shown in FIG. 13A. The post exposure bake, or other baking operations, include protective layer curing and photoresist drying operations are performed in the heating chamber 1350 in some embodiments. The heating chamber 1350 includes a gas flow inlet 1360 in the chamber, and a gas flow exhaust 1370. In some embodiments, the gas flow inlet 1360 includes multiple inlet ports or there are multiple gas flow inlets. In some embodiments, the gas flow exhaust 1370 includes multiple exhaust ports or there are multiple gas flow exhausts. In some embodiments, it is desirable to have stable, laminar gas flow through the chamber. In some embodiments, the gas flow inlet 1360 is on the bottom or side of the chamber 205, and the gas flow exhaust 1370 is on the top of chamber 205. In other embodiments, the gas flow inlet 1360 is on the top of chamber 205, and the gas flow exhaust 1370 is on the bottom or side of the chamber 205. The size, shape, or number of inlet ports or exhaust ports depends on the chamber design, and inlet port and exhaust port size, shape, or number are selected to provide stable, laminar gas flow in chamber.

In some embodiments, the apparatus includes a gas humidifier/dehumidifier 1355 for adjusting the relative humidity in the heating chamber 1350. A gas supply 1375 is connected to the gas inlet 1360 by a gas conduit 1380. A gas heater 1365 is in line with the gas flow inlet 1360 to heat the gas flowing into the chamber. The apparatus also includes a controller 1300, programmed to: control a gas flow into the heating chamber 1350 through the gas flow inlet 1360, control exhaust gas flow from the heating chamber through the gas flow exhaust 1370, control the gas heater 1365 to regulate a temperature of the gas flowing into the heating chamber 1350, and control the humidifier/dehumidifier 1355 to regulate the relative humidity in the heating chamber. In some embodiments, the semiconductor substrate support 1345 includes a heating element. In some embodiments, the semiconductor substrate support 1345 is a hot plate. In some embodiments, one or more temperature sensors 1335 or humidity sensors 1340 are positioned inside the chamber 1350 to monitor the chamber temperature and relative humidity, respectively. The sensors 1335, 1340 are connected to the controller 1300, and the relative humidity and chamber temperature can be regulated using feedback control. The locations of the gas flow inlet 1360, gas flow exhaust 1370, humidifier/dehumidifier 1355, sensors 1335, 1340, wafer stage 1345, and other components of the apparatus shown in FIG. 13A are merely for illustrative purposes, and the various components can be arranged in any feasible or suitable location or arrangement.

In some embodiments, during the PEB process one or more parameters are controlled, wherein the parameters are selected from: gas flow into the heating chamber, exhaust gas flow from the heating chamber, temperature of the gas flowing into the heating chamber, and relative humidity in the heating chamber. In some embodiments, an inlet temperature of the gas flowing into the heating chamber ranges from about 80° C. to about 190° C. In other embodiments, the inlet temperature of the gas flowing into the heating chamber ranges from about 90° C. to about 170° C. In other embodiments, the inlet temperature of the gas flowing into the heating chamber ranges from about 100° C. to about 150° C. At low temperatures below the recited ranges, there may be insufficient acid generated, leading to decreased pattern definition. At high temperatures above the recited range increased resist outgas sing and the accompanying release of metal contaminants may result in the heating chamber.

In some embodiments, a flow rate of the gas flowing into the heating chamber ranges from about 5 L/min to about 40 L/min during the PEB process. In other embodiments, the flow of the gas flowing into the heating chamber ranges from about 10 L/min to about 30 L/min.

In some embodiments, a flow rate of exhaust gas from the heating chamber ranges from about 10 L/min to about 50 L/min during the PEB process. In other embodiments, the flow rate of exhaust gas from the heating chamber ranges from about 20 L/min to about 40 L/min.

At inlet and exhaust gas flow rates below the disclosed ranges, insufficient removal of resist outgas products, such as metal contaminants may result. At flow rates above the disclosed ranges turbulent flow may result and increased metal contaminant outflow from the photoresist layer may result.

In some embodiments, the relative humidity in the heating chamber ranges from about 1% to about 50% during the PEB process. In some embodiments, the relative humidity in the heating chamber ranges from about 10% to about 45% during the PEB process. At relative humidity above the disclosed range, condensation of resist outgas may result, leaving metal contaminants on the surfaces inside the chamber. At relative humidity below the disclosed range there may not be a substantial improvement in resist outgas condensation.

In some embodiments, the post exposure bake (PEB) process is performed for less than about 5 minutes. In some embodiments, the PEB process is performed for about 10 seconds to about 5 minutes. In other embodiments, the duration of the PEB process is about 20 seconds to about 4 minutes, and about 30 seconds to about 3 minutes in yet other embodiments.

In some embodiments, the gas flowing into the heating chamber includes one or more of clean air, nitrogen, argon, neon, and helium.

In some embodiments, the controller 1300 is programmed to control the gas flow into the heating chamber through the gas flow inlet 1360 at a flow rate ranging from about 5 L/min to about 40 L/min. In other embodiments, the controller 1300 is programmed to control the flow of the gas flowing into the heating chamber 1350 at a flow rate from about 10 L/min to about 30 L/min. In some embodiments, the controller 1300 is programmed to control the inlet temperature of the gas flowing into the heating chamber 1350 at about 80° C. to about 190° C. In other embodiments, the controller 1300 is programmed to control the inlet temperature of the gas flowing into the heating chamber 1355 from about 100° C. to about 150° C. In other embodiments, the controller 1300 is programmed to control the inlet temperature of the gas flowing into the heating chamber 1350 from about 120° C. to about 170° C. In some embodiments, the controller 1300 is programmed to control a flow rate of exhaust gas from the heating chamber 1350 ranges from about 10 L/min to about 50 L/min during the PEB process. In other embodiments, the controller 1300 is programmed to control the flow rate of exhaust gas from the heating chamber ranges from about 20 L/min to about 40 L/min. In some embodiments, the controller 1300 is programmed to control the relative humidity in the heating chamber at a relative humidity ranging from about 1% to about 50% during the PEB process. In some embodiments, the controller 1300 is programmed to control the relative humidity in the heating chamber at a relative humidity ranging from about 10% to about 45% during the PEB process.

In some embodiments at low inlet gas flow rates of less than about 5 L/min or low exhaust gas flow rates of less than about 10 L/min the photoresist outgas is not sufficiently removed from the heating chamber. In some embodiments at high inlet gas flow rates greater than 40 L/min or high exhaust gas flow rates of greater than 50 L/min the gas flow is turbulent and is less efficient at removing photoresist outgas. Under the turbulent gas flow at high inlet or high exhaust gas flow rates dead zones may form where the resist outgas contaminants may settle and not be carried out of the heating chamber by the gas flow. In some embodiments, laminar gas flow in the heating chamber is desirable.

As shown in FIG. 13A, in some embodiments, a substrate 1395, such as a silicon wafer, is placed over a wafer stage (semiconductor substrate support) 1345. A target layer to be patterned 1390 is disposed over the wafer 1395, and a photoresist layer 1385 is disposed over the target layer 1390. In some embodiments, the wafer stage 1345 includes a heating element, which is controlled by the controller 1300, to heat photoresist-coated substrate during the PEB or other baking operation. In some embodiments, the photoresist-coated wafer is heated by introducing a heated gas through the gas inlet 1360. In some embodiments, the controller 1300 controls the flow rate and the temperature of the heated gas. Photoresist outgas is carried by the heated inlet gas to the gas exhaust 1370 to be removed from the heating chamber, thereby preventing the outgas contaminants from contaminating the chamber. In some embodiments, the gas outlet 1370 includes a pump or other mechanical device to exhaust the gas.

As shown in FIG. 13A, at higher baking temperatures resist outgas sing increases, while at lower baking temperatures resist outgassing decreases. In addition, at higher exhaust and inlet gas flow rates turbulence increase thereby leading inefficient removal of outgas removal from the chamber. On the other hand, at lower exhaust and inlet gas flow rates, the gas flow may not be sufficient to remove the photoresist outgas.

FIGS. 13B and 13C illustrate a controller for controlling the post-exposure baking operation, or other baking operations during methods of the present disclosure. In some embodiments, a computer system 1300 is used as the controller for controlling the baking operations. All of or a part of the processes, method and/or operations of the foregoing embodiments can be realized using computer hardware and computer programs executed thereon. In FIG. 13B, a computer system 1300 is provided with a computer 1301 including an optical disk read only memory (e.g., CD-ROM or DVD-ROM) drive 1305 and a magnetic disk drive 1306, a keyboard 1302, a mouse 1303, and a monitor 1304.

FIG. 13C is a diagram showing an internal configuration of the computer system 1300. In FIG. 13C, the computer 1301 is provided with, in addition to the optical disk drive 1305 and the magnetic disk drive 1306, one or more processors, such as a micro processing unit (MPU), a ROM 1312 in which a program such as a boot up program is stored, a random access memory (RAM) 1313 that is connected to the MPU 1211 and in which a command of an application program is temporarily stored and a temporary storage area is provided, a hard disk 1314 in which an application program, a system program, and data are stored, and a bus 1315 that connects the MPU 1311, the ROM 1312, and the like. Note that the computer 1301 may include a network card (not shown) for providing a connection to a LAN.

The program for causing the computer system 1300 to execute the functions of an apparatus for baking the coated substrates in any of the foregoing embodiments may be stored in an optical disk 1321 or a magnetic disk 1322, which are inserted into the optical disk drive 1305 or the magnetic disk drive 1306, and transmitted to the hard disk 1314. Alternatively, the program may be transmitted via a network (not shown) to the computer 1301 and stored in the hard disk 1314. At the time of execution, the program is loaded into the RAM 1313. The program may be loaded from the optical disk 1321 or the magnetic disk 1322, or directly from a network. The program does not necessarily have to include, for example, an operating system (OS) or a third party program to cause the computer 1301 to execute the baking operations in the foregoing embodiments. The program may only include a command portion to call an appropriate function (module) in a controlled mode and obtain desired results.

Figure 14:
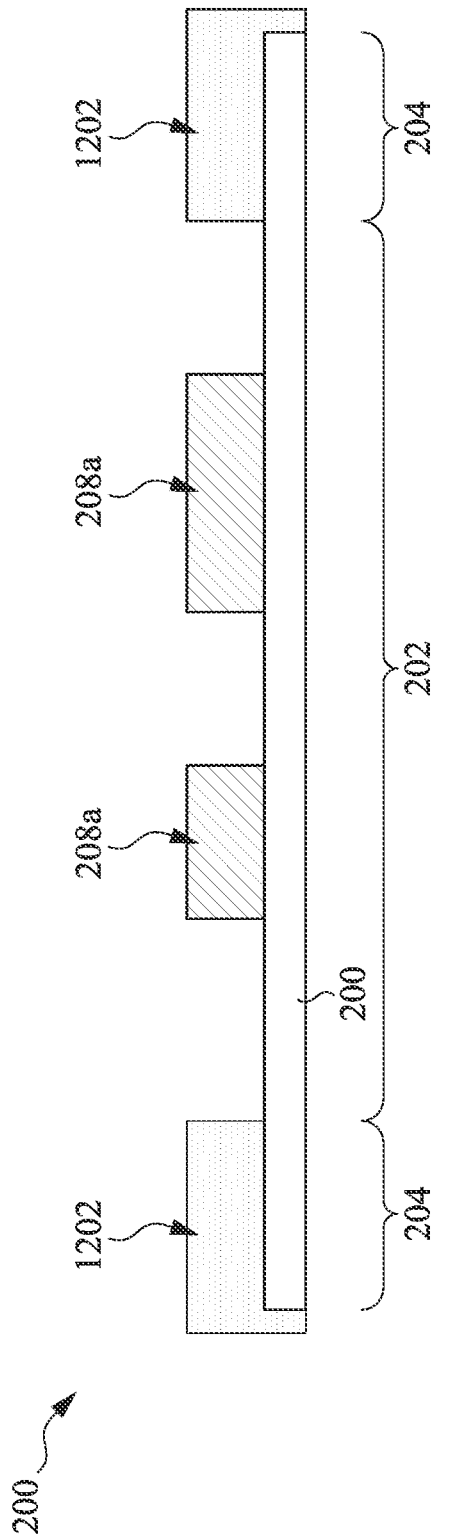
FIG. 14 shows a process stage of a sequential operation according to an embodiment of the disclosure.

Referring to FIGS. 1 and 14, the method 100 then proceeds to operation 114 by developing the exposed resist layer 208 using a developer. By the developing operation, a patterned resist layer is formed. In some embodiments, the resist layer 208 experiences a polarity change after the operation 106, and a dual-tone developing process may be implemented. In some examples, the resist layer 208 is changed from a nonpolar state (hydrophobic state) to a polar state (hydrophilic state), then the exposed portions 208*b* will be removed by an aqueous solvent (positive tone imaging), such as tetramethyl ammonium hydroxide (TMAH), or alternatively the unexposed portions 208*a* will be removed by an organic solvent (negative tone imaging), such as butyl acetate. In some other examples, the resist layer 208 is changed from a polar state to a nonpolar state, then the exposed portions 208*b* will be removed by an organic solvent (positive tone imaging) or the unexposed portions 208*a* will be removed by an aqueous solvent (negative tone imaging).

In some embodiments, as illustrated in FIG. 14, the exposed portions 208*b* are removed in the developing process. Further, in this embodiment, the patterned resist layer is represented by two line patterns. However, the following discussion is equally applicable to resist patterns represented by trenches.

Figure 15:
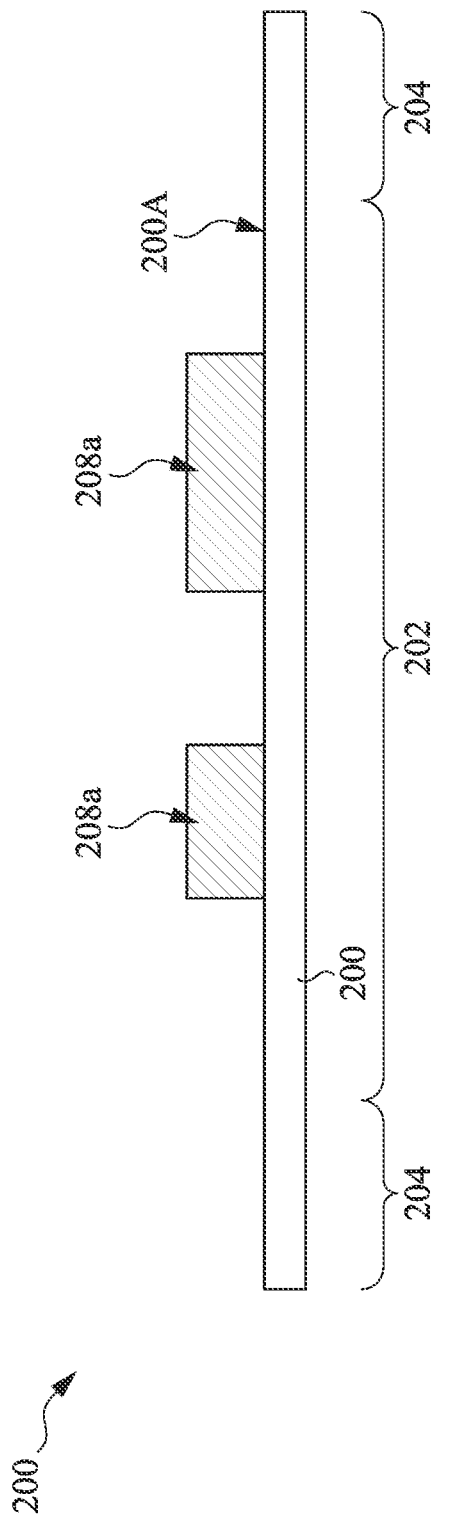
FIG. 15 shows a process stage of a sequential operation according to an embodiment of the disclosure.

Referring to FIGS. 1 and 15, the method 100 then proceeds to operation 116 by removing the second protective layer 1202 from the wafer by a removing solution. The operation 116 is substantially similar to the operation 106. For example, the removing solution is designed to selectively remove the second protective layer 1202 (i.e.—the same to the first protective layer 206 in composition), the resist layer 208 remains after the removal of the second protective layer 1202. The second protective layer 1202 is removed after the developing process at the operation 114. In some embodiments, the operations 114 and 116 are implemented sequentially on the same chemical stage (referred to as a second chemical stage) of the track for efficiency and manufacturing throughput. When the wafer 200 is transferred to the second chemical stage, a first spray tip is positioned to dispense the developer to the wafer 200 secured on the second chemical stage for developing, and thereafter a second spray tip is positioned to dispense a second chemical, such as the removing solution. In some embodiments, OK73 is applied to the wafer 200 in the second chemical stage for removing the second protective layer 1202.

Additional processing operations are performed in some embodiments to manufacture semiconductor devices. In some embodiments, semiconductor fabrication processes are performed to the wafer 200 through the openings of the patterned resist layer in operation 118. In some embodiments, the fabrication process includes an ion implantation process applied to the wafer 200 using the patterned resist layer as an implantation mask, thereby forming various doped features in the wafer 200.

Figure 16:
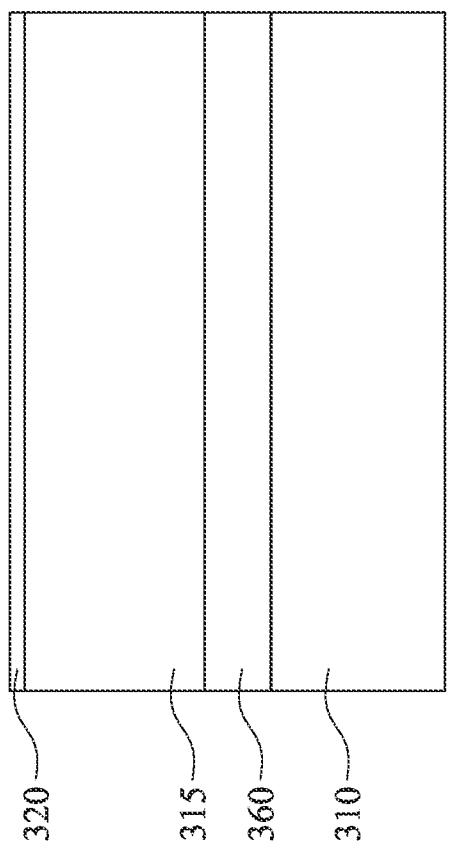
FIG. 16 shows a process stage of a sequential operation according to an embodiment of the disclosure.

Additional semiconductor processing according to embodiments of the disclosure are explained in reference to FIGS. 16-20. FIG. 16 illustrates a portion of a photoresist-coated substrate, such as a wafer. To simplify the explanation of the processing, the central portion of the wafer is illustrated excluding the edge portions of the wafer in FIGS. 16-20. FIG. 16 illustrates a semiconductor substrate 310 with a layer to be patterned 360 disposed thereon. In some embodiments, the layer to be patterned 360 is a hard mask layer; metallization layer; or a dielectric layer, such as a passivation layer, disposed over a metallization layer. In embodiments where the layer to be patterned 360 is a metallization layer, the layer to be patterned 360 is formed of a conductive material using metallization processes, and metal deposition techniques, including chemical vapor deposition, atomic layer deposition, and physical vapor deposition (sputtering). Likewise, if the layer to be patterned 360 is a dielectric layer, the layer to be patterned 360 is formed by dielectric layer formation techniques, including thermal oxidation, chemical vapor deposition, atomic layer deposition, and physical vapor deposition. A photoresist layer 315, as described herein, is disposed over the layer to be patterned. In some embodiments, an optional protective upper layer 320, such as polysiloxane layer, is disposed over the photoresist layer 315.

Figure 17A:
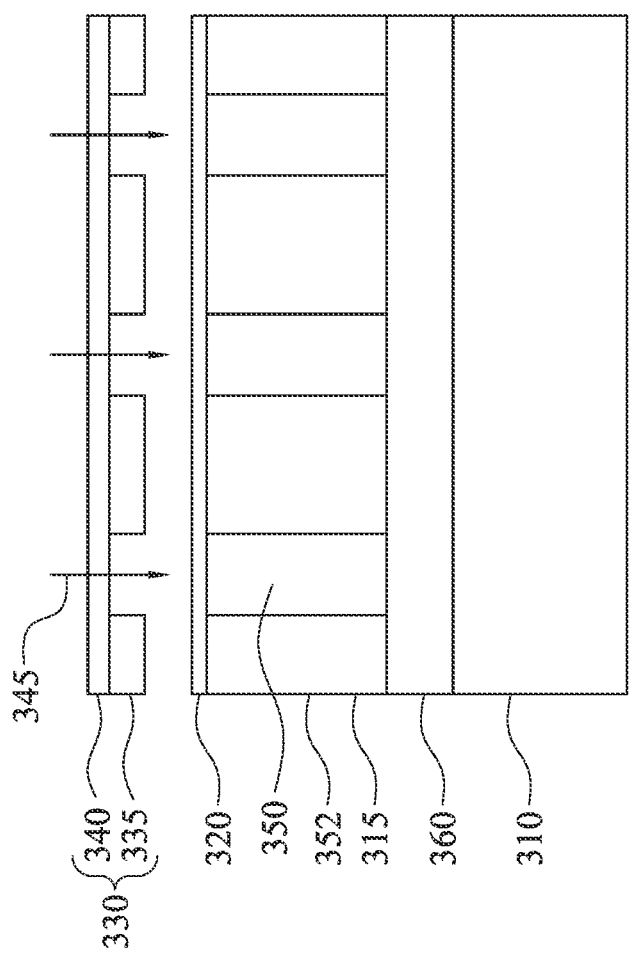
FIGS. 17A and 17B show process stages of a sequential operation according to an embodiment of the disclosure.
Figure 17B:
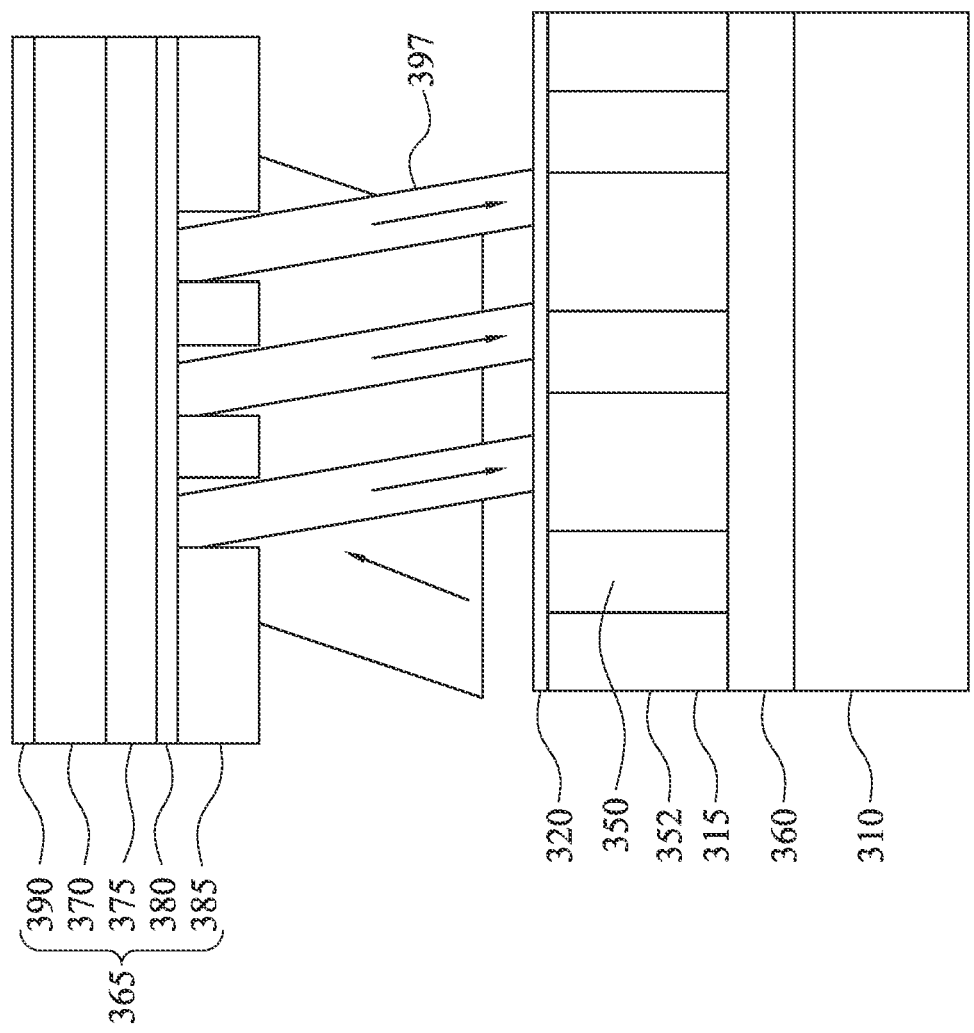

FIGS. 17A and 17B illustrate selective exposures of the photoresist layer to form an exposed region 350 and an unexposed region 352. In some embodiments, the exposure to radiation is carried out by placing the photoresist-coated substrate in a photolithography tool. The photolithography tool includes a photomask 330/365, optics, an exposure radiation source to provide the radiation 345/397 for exposure, and a movable stage for supporting and moving the substrate under the exposure radiation.

In some embodiments, the radiation source (not shown) supplies radiation 345/397, such as ultraviolet light, to the photoresist layer 315 in order to induce a reaction of the PACs, which in turn reacts with the polymer to chemically alter those regions of the photoresist layer to which the radiation 345/397 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 345/397 is patterned by the photomask 330/365. In some embodiments, the optics include one or more lenses, mirrors, filters, and combinations thereof to control the radiation 345/397 along its path.

In an embodiment, the patterned radiation 345/397 is extreme ultraviolet light having a 13.5 nm wavelength, the PAC is a photoacid generator, the group to be decomposed is a carboxylic acid group on the hydrocarbon structure, and a cross linking agent is used. The patterned radiation 345/397 impinges upon the photoacid generator, the photoacid generator absorbs the impinging patterned radiation 345/397. This absorption initiates the photoacid generator to generate a proton (e.g., a $H^+$ atom) within the photoresist layer 315. When the proton impacts the carboxylic acid group on the hydrocarbon structure, the proton reacts with the carboxylic acid group, chemically altering the carboxylic acid group and altering the properties of the polymer in general. The carboxylic acid group then reacts with the cross-linking agent in some embodiments to cross-link with other polymers within the exposed region of the photoresist layer 315.

In some embodiments, the exposure of the photoresist layer 315 uses an immersion lithography technique. In such a technique, an immersion medium (not shown) is placed between the final optics and the photoresist layer, and the exposure radiation 345 passes through the immersion medium.

In some embodiments, the thickness of the optional upper layer 320 is sufficiently thin so that the upper layer 320 does not adversely affect the exposure of the photoresist layer 315 to the radiation 345/397.

After the photoresist layer 315 has been exposed to the exposure radiation 345/397 a post-exposure baking (PEB) is performed as described herein to remove contaminants, and assist in the generating, dispersing, and reacting of the acid/base/free radical generated from the impingement of the radiation 345/397 upon the PACs during the exposure. As described herein, gas is flowed over the photoresist layer at specific, controlled flow rates, temperature, and relative humidity.

Development is subsequently performed using a solvent, as shown in FIG. 18. In some embodiments where positive tone development is desired, a positive tone developer such as a basic aqueous solution is used to remove regions 350 of the photoresist exposed to radiation. In some embodiments, the positive tone developer 357 includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

In some embodiments where negative tone development is desired, an organic solvent or critical fluid is used to remove the unexposed regions 352 of the photoresist. In some embodiments, the negative tone developer 357 includes one or more selected from hexane, heptane, octane, toluene, xylene, dichloromethane, chloroform, carbon tetrachloride, trichloroethylene, and like hydrocarbon solvents; critical carbon dioxide, methanol, ethanol, propanol, butanol, and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, and N,N-dimethyl formamide or the like.

In some embodiments, the developer 357 is applied to the upper layer 320 and photoresist layer 315 using a spin-on process. In the spin-on process, the developer 357 is applied to the upper layer 320 and photoresist layer 315 by a dispenser 362 from above while the coated substrate is rotated, as shown in FIG. 18. The developer 357 is selected so that it both removes the optional upper layer 320 and the appropriate region of photoresist layer 315. In the case of a positive resist, the exposed region 350 of the photoresist layer is removed, and in the case of a negative resist the unexposed regions 352 of the photoresist layer are removed. In some embodiments, the developer 357 is supplied at a rate of between about 5 ml/min and about 800 ml/min, while the coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 315 after exposure, it is intended to be illustrative and is not intended to limit the embodiment. Rather, any suitable development operations, including dip processes, puddle processes, and spray-on methods, may alternatively be used. All such development operations are included within the scope of the embodiments.

Figure 19:
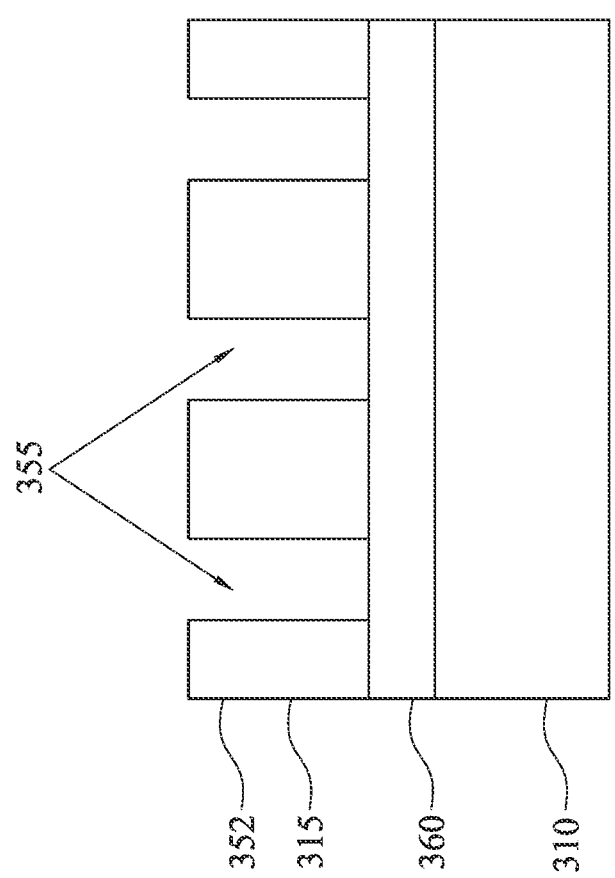
FIG. 19 shows a process stage of a sequential operation according to an embodiment of the disclosure.

During the development process, the developer 357 dissolves the radiation unexposed regions 352 of the cross-linked negative resist, exposing the surface of the layer to be patterned, as shown in FIG. 19, and leaving behind well-defined exposed photoresist regions 355, in some embodiments.

Figure 20:
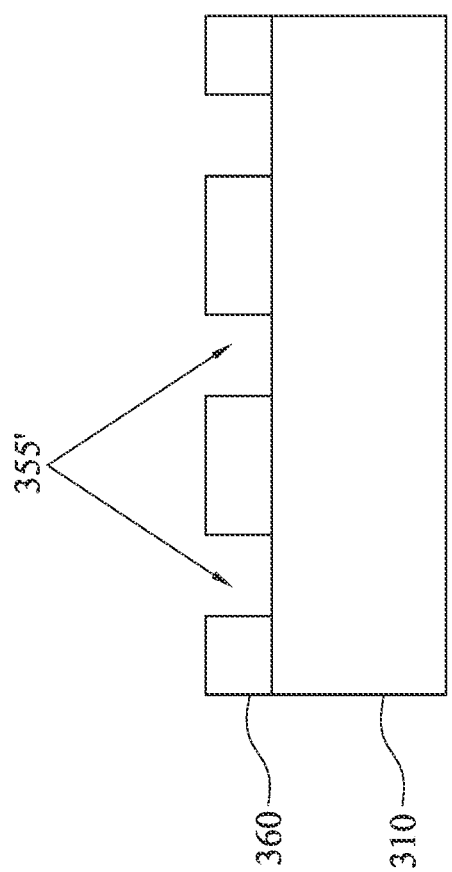
FIG. 20 shows a process stage of a sequential operation according to an embodiment of the disclosure.

After the developing operation, remaining developer is removed from the patterned photoresist covered substrate. The remaining developer is removed using a spin-dry process in some embodiments, although any suitable removal technique may be used. After the photoresist layer 315 is developed, and the remaining developer is removed, additional processing is performed while the patterned photoresist layer 350 is in place. For example, an etching operation, using dry or wet etching, is performed in some embodiments, to transfer the pattern 355 of the photoresist layer 352 to the layer to be patterned 360, forming recesses 355' as shown in FIG. 20. The layer to be patterned 360 has a different etch resistance than the photoresist layer 315. In some embodiments, the etchant is more selective to the layer to be patterned 310 than the photoresist layer 315.

In some embodiments, the layer to be patterned 360 and the photoresist layer 315 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

In some embodiments, etching operations include a dry (plasma) etching, a wet etching, and/or other etching methods. For example, a dry etching operation may implement an oxygen-containing gas, a fluorine-containing gas, a chlorine-containing gas, a bromine-containing gas, an iodine-containing gas, other suitable gases and/or plasmas, and/or combinations thereof. The patterned resist layer may be partially or completely consumed during the etching of the hard mask layer. In an embodiment, any remaining portion of the patterned resist layer may be stripped off, leaving a patterned hard mask layer over the wafer.

Other embodiments include other operations before, during, or after the operations described above. In an embodiment, the method includes forming fin field effect transistor (FinFET) structures. In some embodiments, a plurality of active fins are formed on the semiconductor substrate. Such embodiments, further include etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the method includes other operations to form a plurality of gate electrodes on the semiconductor substrate. The method may further include forming gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

Figure 21:
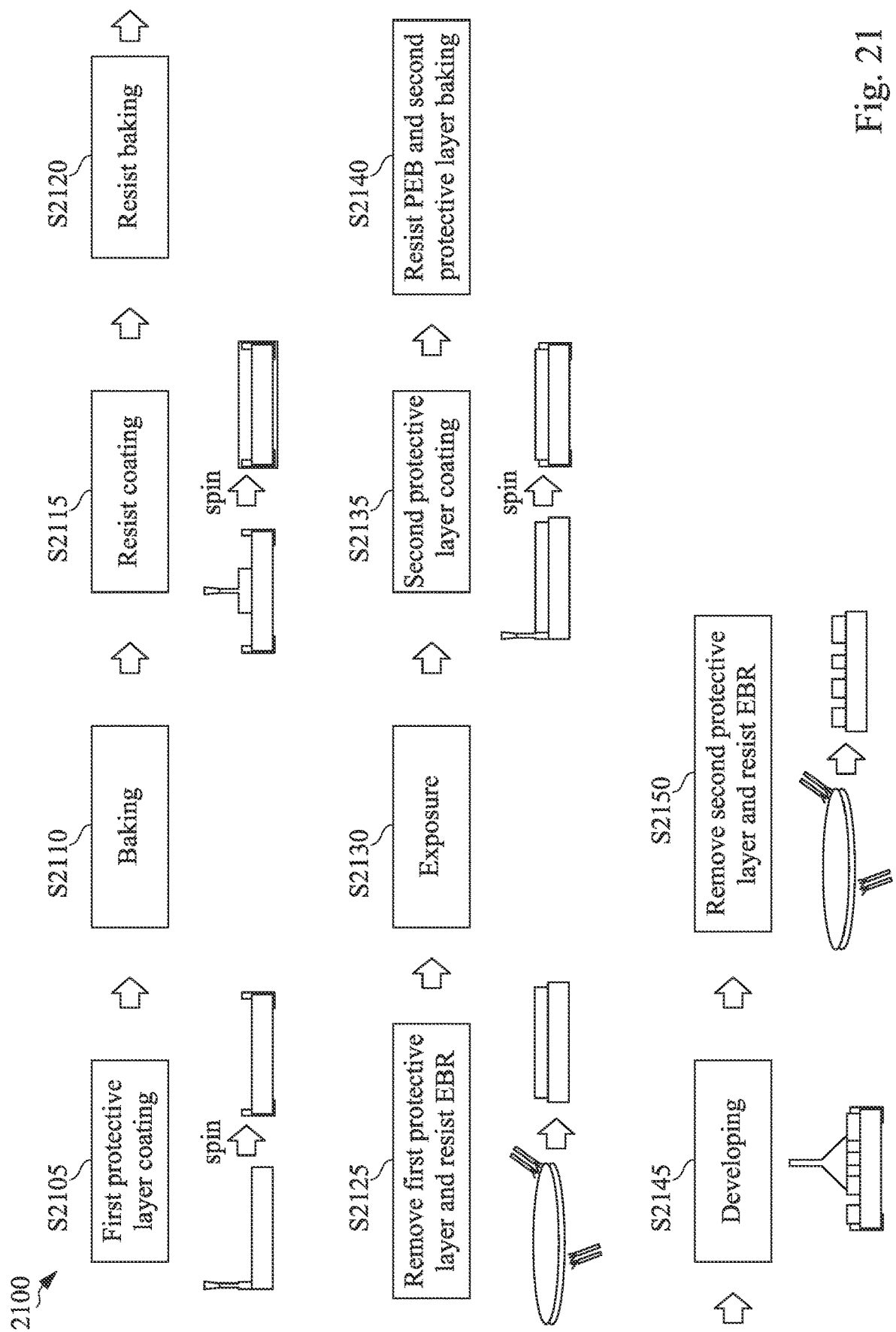
FIG. 21 illustrates a process flow according to embodiments of the disclosure.

A method S2100 of manufacturing a semiconductor device according to an embodiment of the disclosure is illustrated in FIG. 21. A first protective layer is spin coated over an edge portion of a semiconductor substrate in operation S2105. The edge-coated wafer undergoes a softbaking operation in operation S2110 to cure/dry the first protective layer at a temperature of about 40° C. to about 120° C. Then a photoresist, such as a metal-containing photoresist, is disposed over the semiconductor substrate in operation S2115 to form a photoresist layer. The photoresist layer is subsequently heated in resist baking operation S2120 to dry the photoresist layer at a temperature of about 40° C. to about 120° C. After drying the photoresist layer, in operation S2125, the first protective layer is removed along with a portion of the photoresist overlying the first protective layer in an edge bead removal (EBR) operation. The photoresist layer is subsequently selectively exposed to actinic radiation in operation S2130 to form a latent pattern therein. Then, in operation S2135, a second protective layer is disposed over the edge portion of the semiconductor substrate. The second protective layer and the photoresist layer subsequently undergo a post exposure baking operation S2140. During the post exposure baking operation S2140, the temperature, gas flow rate, and relative humidity parameters are controlled as disclosed herein. The photoresist layer is subsequently developed in operation S2145 to form a pattern and the second protective layer the resist edge bead are removed in operation S2150. The semiconductor substrate then undergoes additional manufacturing operations to form a semiconductor device.

Figure 22:
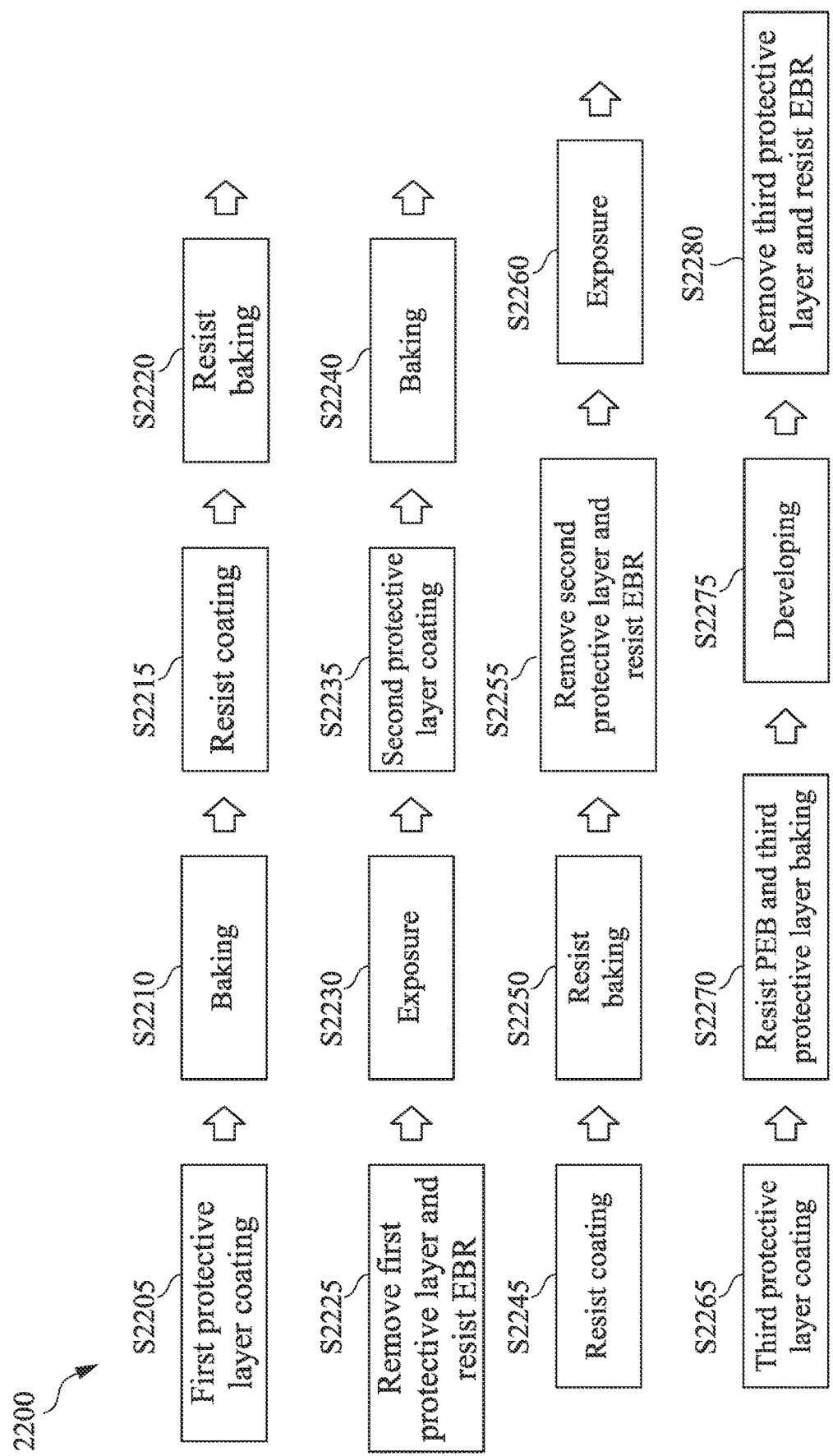
FIG. 22 illustrates a process flow according to embodiments of the disclosure.
Figure 23:
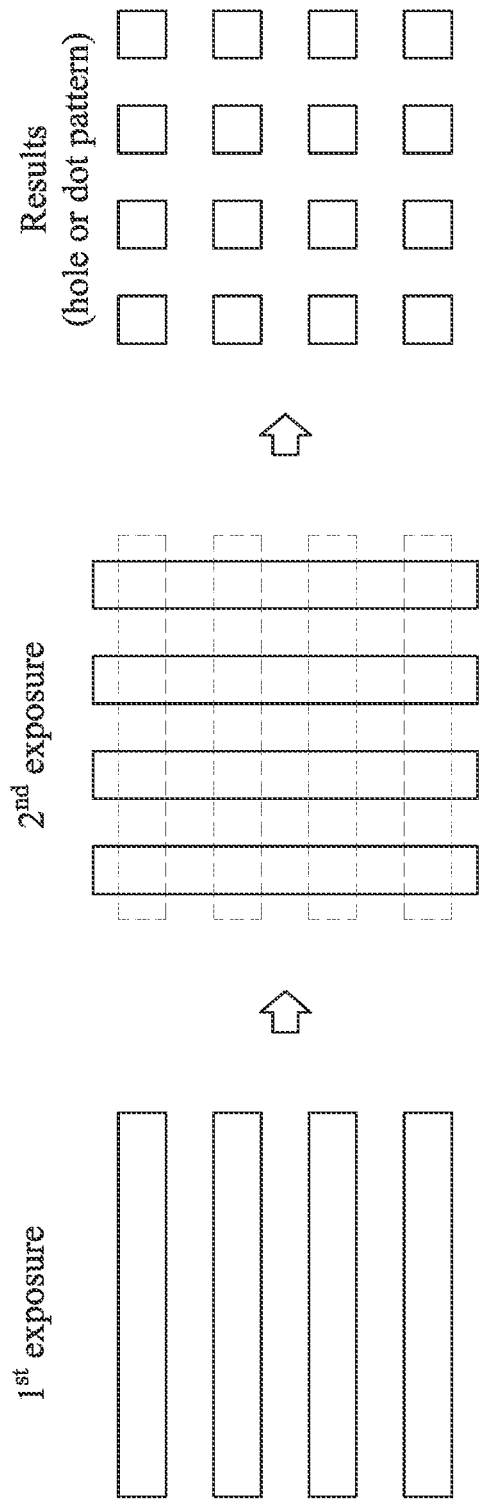
FIG. 23 illustrates photoresist patterns formed according to embodiments of the disclosure.

Another method 2200 of manufacturing a semiconductor device according to an embodiment of the disclosure is illustrated in FIG. 22. In operation S2205, a first protective layer is spin coated over an edge portion of a semiconductor substrate. The edge-coated wafer undergoes softbaking in operation S2210 to cure/dry the first protective layer at a temperature of about 40° C. to about 120° C. Then, in operation S2215 a photoresist, such as a metal-containing photoresist is disposed over the semiconductor substrate to form a first photoresist layer. In operation S2220, the first photoresist layer is heated to dry the first photoresist layer at a temperature of about 40° C. to about 120° C. After drying the first photoresist layer, the first protective layer is removed in operation S2225, along with a portion of the photoresist layer overlying the first protective layer in an edge bead removal (EBR) operation. In operation S2230, the first photoresist layer is subsequently selectively exposed to actinic radiation to form a first latent pattern therein. A plurality of latent pattern features extend in a first direction and are arranged along a second direction intersecting the first direction. In some embodiments, the first and second directions are substantially orthogonal. Then a second protective layer is disposed over the edge portion of the semiconductor substrate in operation S2235. The second protective layer and the first photoresist layer subsequently undergo post exposure baking in operation S2240. During the post exposure bake, the temperature, gas flow rate, and relative humidity parameters are controlled as disclosed herein. Next, in operation S2245, a second photoresist, such as a metal-containing photoresist, is disposed over the first photoresist layer to form a second photoresist layer. The second photoresist layer is heated in operation S2250 to dry the second photoresist layer at a temperature of about 40° C. to about 120° C. After drying the second photoresist layer, the second protective layer is removed in operation S2255 along with a portion of the second photoresist layer overlying the second protective layer in an edge bead removal (EBR) operation. The second photoresist layer is subsequently selectively exposed to actinic radiation in operation S2260 to form a second latent pattern therein. A plurality of second latent pattern features extend in the second direction and are arranged along the first direction intersecting the second direction. Then, in operation S2265, a third protective layer is disposed over the edge portion of the semiconductor substrate. The third protective layer and the second photoresist layer undergo post exposure baking in operation S2270. During the post exposure bake, the temperature, gas flow rate, and relative humidity parameters are controlled as disclosed herein. Then, in operation S2275, the first and second photoresist layers are subsequently developed to form a pattern and the third protective layer is removed in operation S2280. The resulting photoresist pattern is illustrated in FIG. 23, which shows the latent pattern formed by the first exposure, the latent pattern formed by the second exposure, and the resulting pattern formed by the developing operation. The semiconductor substrate then undergoes additional manufacturing operations to form a semiconductor device.

Figure 24:
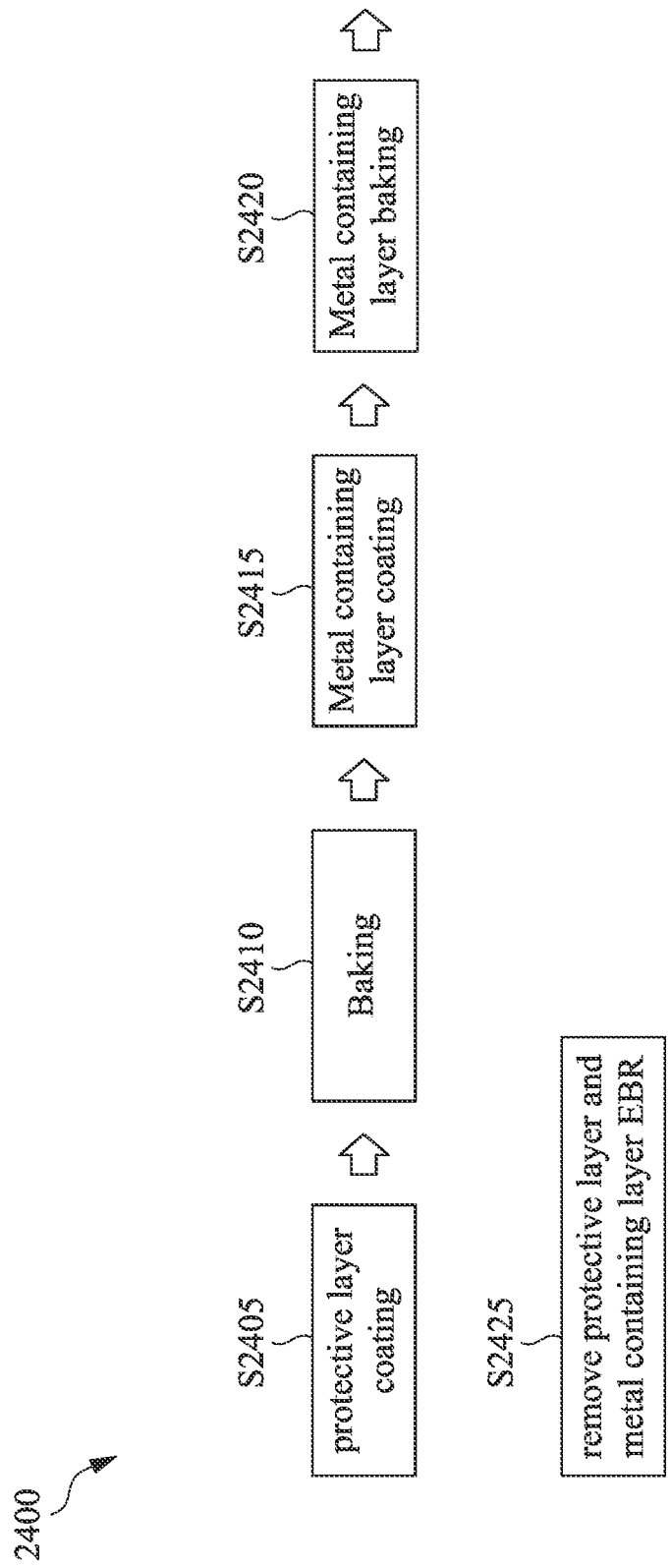
FIG. 24 illustrates a process flow according to embodiments of the disclosure.

Another embodiment of a method 2400 according to the disclosure is illustrated in FIG. 24. In this embodiment, a first protective layer is formed over an edge portion of a first main surface of a semiconductor substrate in operation S2405. Then, the first protective layer is heated to cure/dry the first protective layer in operation S2410. Next, in operation S2415, a metal-containing layer is formed over the first main surface of the semiconductor substrate. Then, the first protective layer and the metal-containing layer are heated in operation S2420. In some embodiments, the first protective layer and metal-containing layer are heated while controlling the inlet and exhaust gas flow rates, inlet gas temperature, and relative humidity as disclosed herein with respect to the various embodiments. The first protective layer and the metal-containing layer are subsequently removed from over the edge portion of the semiconductor substrate in operation S2425. In some embodiments, the heating of the protective layer and the metal-containing layer is at a temperature ranging from about 100° C. to about 200° C. for about 10 seconds to about 5 minutes. In some embodiments, the method includes a second heating of the protective layer at a temperature of about 40° C. to about 120° C. before forming the metal-containing layer. In some embodiments, the metal-containing layer includes one or metals selected from the group consisting of Ti, Al, Hf, Sn, Si, Zr, Ta, W, Cu, Co, La, and Mn. In some embodiments, the one or more metals are included in a metal compound or alloy. In some embodiments, the metal compound or alloy is one or more selected from the group consisting of $TiO_2$, $Al_2O_3$, TaN, $SiO_2$, ZrSiO, and HfSiO.

The present disclosure provides a method for lithography process. The disclosed method includes coating the wafer edge such that the resist material is constrained to be coated on the front surface of the wafer within the circuit region so that the wafer edge is either free of resist material during a lithography patterning method or not directly coated on by resist. Thus, the wafer is protected by the (first/second) protective layer to eliminate various concerns, including metal contaminations, during the lithography process. Control of the post exposure bake operation, including control of the gas flow rate, temperature, and relative humidity provides improved contaminant removal of contaminants generated by photoresist out gassing.

The disclosed methods may include other operations before, during or after the operations described above. In an embodiment, the wafer is a semiconductor substrate and the method proceeds to forming fin field effect transistor (FinFET) structures. In some embodiments, the method includes forming a plurality of active fins in the semiconductor substrate of the wafer. In furtherance of the embodiment, the method further includes etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the disclosed methods include other operations to form a plurality of gate electrodes on the semiconductor substrate or the wafer. The disclosed methods may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched by operation to form a plurality of trenches. The disclosed methods include filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the disclosed methods according to various aspects of the present disclosure.

As described above, the semiconductor wafer may be an intermediate structure fabricated during processing of an IC, or a portion thereof, that may include logic circuits, memory structures, passive components (such as resistors, capacitors, and inductors), and active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

In some embodiments, the contaminants produced by photoresist outgassing is controlled to less than about $100 \times 10^{11}$ atom/cm$^2$. In other embodiments, the contaminants generated by photoresist outgassing is controlled to less than about $1 \times 10^{11}$ atom/cm$^2$. In some embodiments, the defect rate is reduced by greater than 30% compared to semiconductor device manufacturing methods not employing the methods of the present disclosure.

The embodiments of the present disclosure offer advantages over existing art, though it is understood that other embodiments may offer different advantages, not all advantages are necessarily discussed herein, and that no particular advantage is required for all embodiments. By utilizing the disclosed method, the accumulation of the resist material on wafer edge and associated issues (such as contamination and resist peeling) are eliminated, and contamination caused by photoresist outgassing is substantially inhibited. In other examples, the disclosed method is economical and efficient to implement, therefore the manufacturing cost is reduced and the manufacturing throughput is increased. Furthermore, there is no additional contamination introduced by the wafer edge modification.

Embodiments of the present disclosure reduce contamination of semiconductor substrates and subsequently formed devices. Embodiments of the present disclosure reduce contamination of semiconductor manufacturing tools. The reduction in contamination leads to improved device yield and reduced manufacturing tool downtime in some embodiments.

The embodiments of the present disclosure offer advantages over existing art, though it is understood that other embodiments may offer different advantages, not all advantages are necessarily discussed herein, and that no particular advantage is required for all embodiments. By utilizing the disclosed methods, the accumulation of the resist material on wafer edge and associated issues (such as contamination and resist peeling) are eliminated. In other examples, the disclosed method to form a protected wafer edge is easy to implement, therefore the manufacturing cost is reduced and the manufacturing throughput is increased. Furthermore, there is no additional contamination introduced by the wafer edge modification. In other examples, the various operations are collectively implemented on a same wafer stage of the track to increase the processing efficiency and decrease the manufacturing cost.

An embodiment of the disclosure includes a method of manufacturing a semiconductor device, including forming a first protective layer over an edge portion of a first main surface of a semiconductor substrate. A metal-containing photoresist layer is formed over the first main surface of the semiconductor substrate. The first protective layer is removed, and the metal-containing photoresist layer is selectively exposed to actinic radiation. A second protective layer is formed over the edge portion of the first main surface of the semiconductor substrate. The selectively exposed photoresist layer is developed to form a patterned photoresist layer, and the second protective layer is removed. In an embodiment, the method includes a first heating of the selectively exposed metal-containing photoresist layer and the second protective layer at a temperature of 100° C. to 200° C. for 10 seconds to 5 minutes. In an embodiment, the semiconductor substrate is placed on a heated surface during the first heating. In an embodiment, a gas at a temperature of 100° C. to 190° C. is flowed over the metal-containing photoresist layer and the second protective layer during the first heating. In an embodiment, a gas at a temperature of 100° C. to 150° C. is flowed over the metal-containing photoresist layer and the second protective layer during the first heating. In an embodiment, the method includes a second heating of the first protective layer at a temperature of 40° C. to 120° C. before forming the metal-containing photoresist layer. In an embodiment, the method includes a third heating of the first protective layer and the metal-containing photoresist layer before removing the first protective layer. In an embodiment, the metal-containing photoresist layer includes one or more of Cs, Ba, La, Ce, In, Sn, or Ag. In an embodiment, a concentration of metal in the metal-containing photoresist layer ranges from 10 wt. % to 80 wt. % based on a total weight of the metal-containing photoresist layer. In an embodiment, the first protective layer and the second protective layer comprise organic material.

In another embodiment of the disclosure, a method of manufacturing a semiconductor device, includes forming a first protective layer over an edge portion of a first main surface of a semiconductor substrate. A photoresist layer is formed over the first main surface of the semiconductor substrate. The first protective layer is removed, and the photoresist layer is selectively exposed to actinic radiation. A second protective layer is formed over the edge portion of the first main surface of the semiconductor substrate. The selectively exposed photoresist layer and the second protective layer are first heated in a heating chamber. During the first heating, the selectively exposed photoresist layer and second protective layer one or more parameters are controlled, wherein the parameters are selected from: gas flow into the heating chamber, exhaust gas flow from the heating chamber, temperature of the gas flowing into the heating chamber, and relative humidity in the heating chamber. In an embodiment, the method includes developing the selectively exposed photoresist layer to form a patterned photoresist layer. In an embodiment, the photoresist layer comprises 10 wt. % to 80 wt. % of a metal based on a total weight of the photoresist layer. In an embodiment, an inlet temperature of the gas flowing into the heating chamber ranges from 100° C. to 190° C. In an embodiment, a flow rate of the gas flowing into the heating chamber ranges from 5 L/min to 40 L/min during the first heating. In an embodiment, a flow rate of exhaust gas from the heating chamber ranges from 10 L/min to 50 L/min during the first heating. In an embodiment, the relative humidity in the heating chamber ranges from 1% to 50% during the first heating. In an embodiment, the method includes a second heating of the first protective layer at a temperature of 40° C. to 120° C. before forming the photoresist layer. In an embodiment, the method includes a third heating of the first protective layer and the photoresist layer before removing the first protective layer.

Another embodiment of the disclosure is a semiconductor manufacturing apparatus, including a heating chamber; a semiconductor substrate support, a gas flow inlet, and a gas flow exhaust in the heating chamber; and a gas heater. A controller is programmed to control a gas flow into the heating chamber through the gas flow inlet, control exhaust gas flow from the heating chamber through the gas flow exhaust, control a temperature of the gas flowing into the heating chamber, and control relative humidity in the heating chamber. In an embodiment, the semiconductor substrate support includes a heating element. In an embodiment, the controller is programmed to control the gas flow into the heating chamber through the gas flow inlet at a flow rate ranging from 5 L/min to 40 L/min. In an embodiment, the controller is programmed to control the exhaust gas flow from the heating chamber through the gas flow exhaust at flow rate ranging from 10 L/min to 50 L/min. In an embodiment, the controller is programmed to control the temperature of the gas flowing into the heating chamber at a temperature ranging from 100° C. to 190° C. In an embodiment, the controller is programmed to control the temperature of the gas flowing into the heating chamber at a temperature ranging from 100° C. to 150° C. In an embodiment, the controller is programmed to control relative humidity in the heating chamber at a relative humidity ranging from 1% to 50%.

Another embodiment of the disclosure is a method, including forming a first protective layer over an edge portion of a first main surface of a semiconductor substrate. A metal-containing layer is formed over the first main surface of the semiconductor substrate. The first protective layer and the metal-containing layer are subjected to a first heating. The first protective layer and the metal-containing layer are removed from over the edge portion of the semiconductor substrate. In an embodiment, the first heating of the first protective layer and the metal-containing layer and is at a temperature ranging from 100° C. to 200° C. for 10 seconds to 5 minutes. In an embodiment, a second heating of the first protective layer is performed at a temperature of 40° C. to 120° C. before forming the metal-containing layer. In an embodiment, the metal-containing layer includes one or metals selected from the group consisting of: Ti, Al, Hf, Sn, Si, Zr, Ta, W, Cu, Co, La, and Mn. In an embodiment, the one or more metals are included in a metal compound or alloy. In an embodiment, the metal compound or alloy is one or more selected from the group consisting of $TiO_2$, $Al_2O_3$, TaN, $SiO_2$, ZrSiO, and HfSiO. Another embodiment of the disclosure is a method of manufacturing a semiconductor device, including forming a first protective layer over an edge portion of a first main surface of a semiconductor substrate. A first metal-containing photoresist layer is formed over the first main surface of the semiconductor substrate. The first protective layer is removed, and the first metal-containing photoresist layer is selectively exposed to actinic radiation to form a first plurality of latent pattern features extending along a first direction and arranged along a second direction. A second protective layer is formed over the edge portion of the first main surface of the semiconductor substrate. The selectively exposed first photoresist layer is developed to form a patterned photoresist layer including a first plurality of pattern features extending along a first direction and arranged along a second direction. A second metal-containing photoresist layer is formed over the first plurality of pattern features. The second protective layer is removed and the second metal-containing photoresist layer is selectively exposed to actinic radiation to form a second plurality of latent pattern features extending along the second direction and arranged along the first direction. A third protective layer is formed over the edge portion of the first main surface of the semiconductor substrate. The selectively exposed second photoresist layer is developed to form a patterned photoresist layer including a second plurality of pattern features. In an embodiment, the method includes removing the third protective layer. In an embodiment, the method includes a first heating of the selectively exposed first metal-containing photoresist layer and the second protective layer at a temperature of 100° C. to 150° C. for 10 seconds to 5 minutes. In an embodiment, the method includes a second heating of the selectively exposed second metal-containing photoresist layer and the third protective layer at a temperature of 100° C. to 150° C. for 10 seconds to 5 minutes. In an embodiment, the semiconductor substrate is placed on a heated surface during the first heating or the second heating. In an embodiment, a gas at a temperature of 100° C. to 150° C. is flowed over the selectively exposed first metal-containing photoresist layer and the second protective layer during the first heating or over the selectively exposed second metal-containing photoresist layer and the third protective layer during the second heating. In an embodiment, the method includes a third heating of the first protective layer at a temperature of 40° C. to 120° C. before forming the first metal-containing photoresist layer. In an embodiment, the method includes a fourth heating of the second metal-containing photoresist layer at a temperature of 40° C. to 120° C. before removing the second protective layer. In an embodiment, the first metal-containing photoresist and second metal-containing photoresist layer include one or more of Cs, Ba, La, Ce, In, Sn, or Ag. In an embodiment, a concentration of metal in the first metal-containing photoresist layer and the second metal-containing photoresist layer ranges from 10 wt. % to 80 wt. % based on a total weight of the first metal-containing photoresist layer or second metal-containing photoresist layer, respectively. In an embodiment, the first protective layer, the second protective layer, and the third protective layer comprise organic material. In an embodiment, the method includes etching exposed portions of the semiconductor substrate, thereby extending the second plurality of pattern features in the first and second photoresist layers into the semiconductor substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first polymer layer over an edge portion of a first main surface of a substrate;
    forming a first photoresist layer over the first main surface of the substrate;
    removing the first polymer layer;
    patternwise exposing the first photoresist layer to actinic radiation to form a first plurality of latent patterns extending along a first direction and arranged along a second direction;
    forming a second polymer layer over the edge portion of the first main surface of the substrate;
    first heating of the patternwise exposed first photoresist layer and the second polymer layer;
    developing the patternwise exposed first photoresist layer to form a first plurality of patterns extending along a first direction and arranged along a second direction;
    forming a second photoresist layer over the first plurality of patterns;
    removing the second polymer layer;
    patternwise exposing the second photoresist layer to actinic radiation to form a second plurality of latent patterns extending along the second direction and arranged along the first direction;
    forming a third polymer layer over the edge portion of the first main surface of the substrate; and
    developing the patternwise exposed second photoresist layer to form a patterned second photoresist layer including a second plurality of patterns.

2. The method according to claim 1, further comprising removing the third polymer layer.

3. The method according to claim 1, wherein the first heating is at a temperature of 100° C. to 150° C. for 10 seconds to 5 minutes.

4. The method according to claim 3, further comprising a second heating of the patternwise exposed second photoresist layer and the third polymer layer at a temperature of 100° C. to 150° C. for 10 seconds to 5 minutes.

5. The method according to claim 4 wherein a gas at a temperature of 100° C. to 150° C. is flowed over the first photoresist layer and the second polymer layer during the first heating or over the second photoresist layer and the third polymer layer during the second heating.

6. The method according to claim 4, further comprising a third heating of the first polymer layer at a temperature of 40° C. to 120° C. before forming the first photoresist layer.

7. The method according to claim 1, wherein the first photoresist layer or the second photoresist layer includes one or more metals selected from the group consisting of Cs, Ba, La, Ce, In, Sn, and Ag.

8. The method according to claim 7, wherein a concentration of the one or metals in the first photoresist layer or the second photoresist layer ranges from 10 wt. % to 80 wt. % based on a total weight of the first photoresist layer or the second photoresist layer, respectively.

9. A method of manufacturing a semiconductor device, comprising:
    forming a first protective layer over an edge portion around a first main surface of a semiconductor substrate;
    forming a first photoresist layer over the first main surface of the semiconductor substrate;
    removing the first protective layer;
    selectively exposing the first photoresist layer to actinic radiation;
    forming a second protective layer over the edge portion around the first main surface of the semiconductor substrate;
    developing the selectively exposed first photoresist layer to form a first patterned photoresist layer;
    forming a second photoresist layer over the first patterned photoresist layer;
    removing the second protective layer;
    selectively exposing the second photoresist layer to actinic radiation;
    forming a third protective layer over the edge portion and around the first main surface of the semiconductor substrate; and
    developing the selectively exposed second photoresist layer to form a second patterned photoresist layer.

10. The method according to claim 9, further comprising removing the third protective layer.

11. The method according to claim 9, wherein the first photoresist layer comprises a metal and the second photoresist layer comprises a metal.

12. The method according to claim 9, wherein the first photoresist and second photoresist layer include one or more of Cs, Ba, La, Ce, In, Sn, or Ag.

13. The method according to claim 11, wherein a concentration of the metal in the first photoresist layer and the second photoresist layer ranges from 10 wt. % to 80 wt. % based on a total weight of the first photoresist layer or second photoresist layer, respectively.

14. A method of manufacturing a semiconductor device, comprising:
forming a first polymer layer over an edge of a semiconductor wafer;
forming a first photoresist layer over a main surface of the semiconductor wafer;
removing the first polymer layer;
exposing the first photoresist layer to a first pattern of actinic radiation;
forming a second polymer layer over the edge of the semiconductor wafer;
developing the exposed first photoresist layer to form a first patterned layer;
forming a second photoresist layer over the first patterned layer;
removing the second polymer layer;
exposing the second photoresist layer to a second pattern of actinic radiation;
forming a third polymer layer over the edge of the semiconductor wafer; and
developing the exposed second photoresist layer to form a second patterned layer.

15. The method according to claim 14, wherein the first photoresist layer comprises a metal and the second photoresist layer comprises a metal.

16. The method according to claim 15, wherein the first photoresist layer and second photoresist layer include one or more of Cs, Ba, La, Ce, In, Sn, or Ag.

17. The method according to claim 15, wherein a concentration of the metal in the first photoresist layer and the second photoresist layer ranges from 10 wt. % to 80 wt. % based on a total weight of the first photoresist layer or second photoresist layer, respectively.

18. The method according to claim 14, further comprising a first heating of the exposed first photoresist layer and the second polymer layer at a temperature of 100° C. to 150° C. for 10 seconds to 5 minutes.

19. The method according to claim 18, further comprising a second heating of the exposed second photoresist layer and the third polymer layer at a temperature of 100° C. to 150° C. for 10 seconds to 5 minutes.

20. The method according to claim 19, wherein the semiconductor wafer is placed on a heated surface during the first heating or the second heating.

\* \* \* \* \*